United States Patent
Jou et al.

(10) Patent No.: US 12,495,617 B2
(45) Date of Patent: Dec. 9, 2025

(54) SEMICONDUCTOR STRUCTURE AND ELECTROSTATIC DISCHARGE PROTECTION DEVICE

(71) Applicant: Vanguard International Semiconductor Corporation, Hsinchu (TW)

(72) Inventors: Yeh-Ning Jou, Hsinchu (TW); Chih-Hsuan Lin, Hsinchu (TW); Wen-Hsin Lin, Zhubei (TW); Hwa-Chyi Chiou, Hsinchu (TW); Kai-Chieh Hsu, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 427 days.

(21) Appl. No.: 18/171,179

(22) Filed: Feb. 17, 2023

(65) Prior Publication Data
US 2024/0282766 A1 Aug. 22, 2024

(51) Int. Cl.
*H10D 89/60* (2025.01)
*H02H 9/04* (2006.01)

(52) U.S. Cl.
CPC .......... *H10D 89/921* (2025.01); *H02H 9/046* (2013.01); *H10D 89/611* (2025.01);
(Continued)

(58) Field of Classification Search
CPC .. H10D 89/921; H10D 89/611; H10D 89/711; H10D 89/811; H10D 89/911; H02H 9/046
See application file for complete search history.

(56) References Cited

U.S. PATENT DOCUMENTS

| | | | |
|---|---|---|---|
| 6,781,804 B1 * | 8/2004 | Claverie | H10D 89/611 |
| | | | 361/56 |
| 7,285,827 B1 * | 10/2007 | He | H10D 89/611 |
| | | | 257/355 |

(Continued)

FOREIGN PATENT DOCUMENTS

| | | | | |
|---|---|---|---|---|
| CN | 118315382 A | * | 7/2024 | ........... H10D 89/611 |
| TW | 201724457 A | | 7/2017 | |
| TW | 1842323 B | * | 5/2024 | |

OTHER PUBLICATIONS

Taiwanese Office Action and Search Report for Taiwanese Application No. 112100017, dated Oct. 16, 2023.

*Primary Examiner* — William B Partridge
*Assistant Examiner* — Linda J. Fleck
(74) *Attorney, Agent, or Firm* — Birch, Stewart, Kolasch & Birch, LLP

(57) ABSTRACT

A semiconductor structure including a substrate, a first well, a first doped region, a second doped region, a third doped region, a second well, a fourth doped region, and a fifth doped region is provided. The substrate has a first conductivity type. The first well is disposed in the substrate and has a second conductivity type. The first doped region is disposed in the first well and has the second conductivity type. The second doped region is disposed in the first well and has the first conductivity type. The third doped region is disposed in the first well and has the first conductivity type. The second well is disposed in the first well. The fourth doped region is disposed in the second well and has the first conductivity type. The fifth doped region is disposed in the second well and has the second conductivity type.

17 Claims, 15 Drawing Sheets

(52) U.S. Cl.
CPC ......... *H10D 89/711* (2025.01); *H10D 89/811* (2025.01); *H10D 89/911* (2025.01)

(56) References Cited

U.S. PATENT DOCUMENTS

| | | | | |
|---|---|---|---|---|
| 2005/0274963 | A1* | 12/2005 | Takahashi | H10D 18/251 |
| | | | | 257/E29.225 |
| 2006/0175663 | A1* | 8/2006 | Jeon | H10D 89/713 |
| | | | | 257/355 |
| 2009/0230426 | A1* | 9/2009 | Carpenter, Jr. | H10D 89/611 |
| | | | | 257/173 |
| 2016/0204095 | A1* | 7/2016 | Okuyama | H10D 64/62 |
| | | | | 257/577 |
| 2017/0179110 | A1* | 6/2017 | Lee | H10D 89/713 |
| 2018/0323184 | A1* | 11/2018 | Hung | H10D 89/711 |
| 2019/0006364 | A1* | 1/2019 | Sakamoto | H10D 89/711 |
| 2020/0273856 | A1* | 8/2020 | Lee | H10D 89/713 |
| 2023/0154920 | A1* | 5/2023 | Huang | H10D 64/111 |
| | | | | 257/355 |
| 2024/0222361 | A1* | 7/2024 | Chen | H10D 89/713 |

* cited by examiner

SEMICONDUCTOR STRUCTURE AND ELECTROSTATIC DISCHARGE PROTECTION DEVICE

BACKGROUND OF THE INVENTION

Field of the Invention

The present invention relates to a semiconductor structure, and, in particular, to a semiconductor structure device that comprises at least one high-voltage element and at least one low-voltage element.

Description of the Related Art

Component damage caused by electrostatic discharge (ESD) has become one of the most important reliability issues for integrated circuit (IC) products. Integrated circuits are especially susceptible to damage due to ESD phenomena. Therefore, in integrated circuit products, ESD protection components must be placed near all input-output pads to protect the internal core circuits from ESD currents.

BRIEF SUMMARY OF THE INVENTION

In accordance with an embodiment of the disclosure, a semiconductor structure comprises a substrate, a first well, a first doped region, a second doped region, a third doped region, a second well, a fourth doped region, and a fifth doped region. The substrate has a first conductivity type. The first well is disposed in the substrate and has a second conductivity type. The first doped region is disposed in the first well and has the second conductivity type. The second doped region is disposed in the first well and has the first conductivity type. The third doped region is disposed in the first well and has the first conductivity type. The second well is disposed in the first well. The fourth doped region is disposed in the second well and has the first conductivity type. The fifth doped region is disposed in the second well and has the second conductivity type.

In accordance with another embodiment of the disclosure, an electrostatic discharge (ESD) protection device comprises a high-voltage bipolar junction transistor (BJT) and a low-voltage element. The high-voltage BJT is formed in a high-voltage well. The low-voltage element is formed in a well disposed in the high-voltage well. The low-voltage element is coupled between a base and an emitter of the high-voltage BJT.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
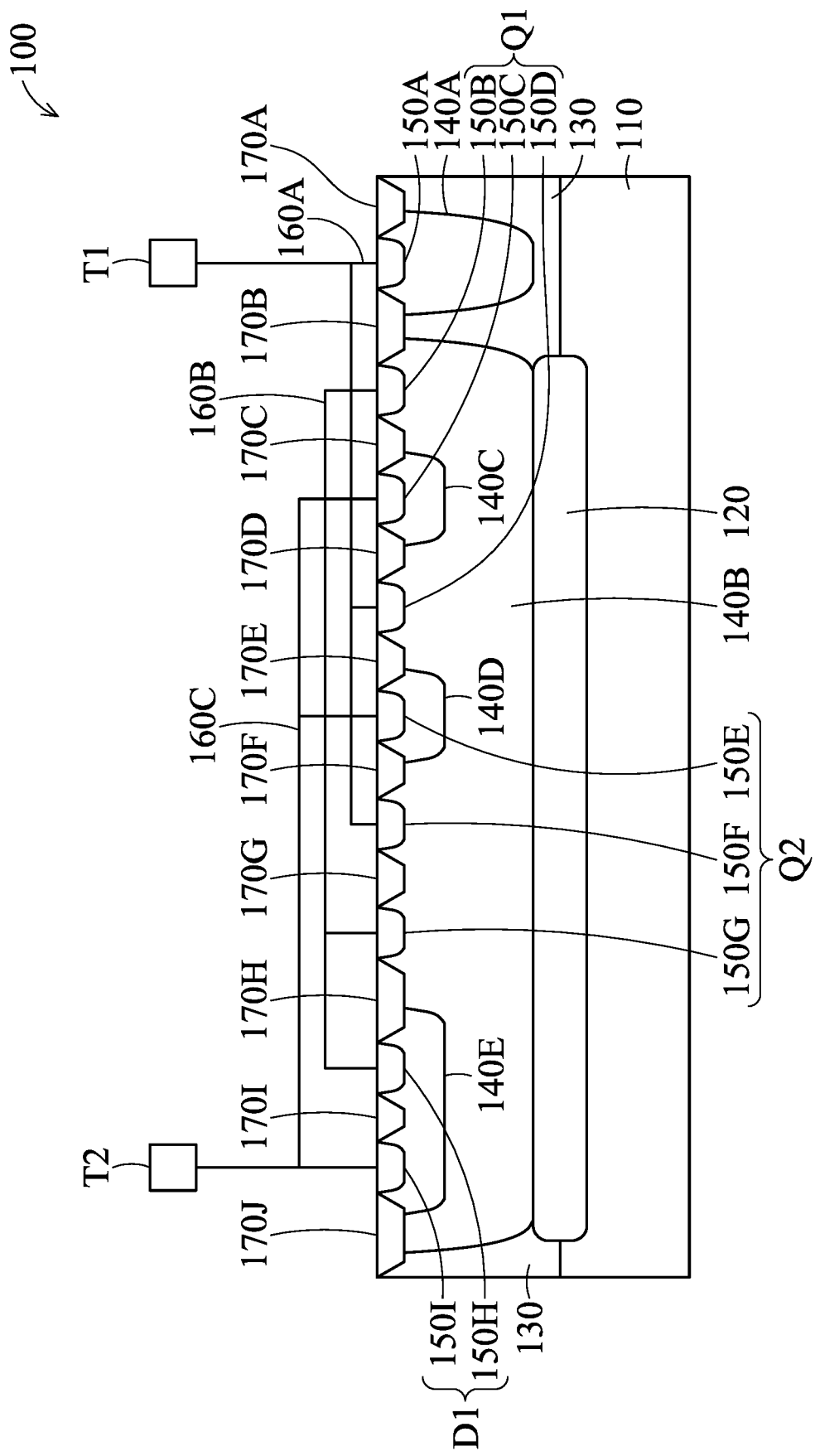
FIG. 1 is a schematic diagram of an exemplary embodiment of a semiconductor structure according to various aspects of the present disclosure.

The present invention is described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a semiconductor structure according to various aspects of the present disclosure. The semiconductor structure 100 comprises a substrate 110, wells 140B and 140E, and doped regions 150B, 150C, 150D, 150H, and 150I. The substrate 110 has a first conductivity type. In one embodiment, the substrate 110 is a silicon substrate, a semiconductor-on-insulator (SOI) substrate, or another suitable semiconductor substrate.

The well 140 is disposed in the substrate 110 and has a second conductivity type. The second conductivity type is opposite to the first conductivity type. For example, when the first conductivity type is P-type, the second conductivity type is N-type. Alternatively, when the first conductivity type is N-type, the second conductivity type is P-type. In one embodiment, the well 140B is a deep high voltage well (DHVW). In this case, when the conductivity type of the well 140B is N-type, the well 140 is referred to as a deep high voltage N-type well (DHVNW). When the conductivity type of the well 140B is P-type, the well 140 is referred to as a deep high voltage P-type well (DHVPW).

In other embodiments, the semiconductor structure 100 further comprises a buried layer 120. The buried layer 120 is disposed on the substrate 110 and has the second conductivity type. The buried layer 120 separates the substrate 110 from the well 140B.

The doped region 150B is disposed in the well 140B and has the second conductivity type. In one embodiment, the doped region 150B is a heavily doped region. In this case, the doping concentration of the doped region 150B is greater than the doping concentration of the well 140B.

The doped region 150C is disposed in the well 140B and has the first conductivity type. In this embodiment, the doped region 150C is a heavily doped region. In one embodiment, the semiconductor structure 100 further comprises a well 140C. The well 140C is disposed in the well 140B and has the second conductivity type. The doped region 150C is disposed in the well 140C. In this case, the doping concentration of the well 140C is higher than the doping concentration of the well 140B.

The doped region 150D is disposed in the well 140B and has the first conductivity type. In this embodiment, the doped region 150D is a heavily doped region. The doping concentration of the doped region 150D is similar to the doping concentration of the doped region 150C.

In some embodiment, the semiconductor structure 100 further comprises isolation structures 170C and 170D. The isolation structure 170C separates the doped regions 150B and 150C. The isolation structure 170D separates the doped region 150C from the doped region 150D. In one embodiment, the isolation structures 170C and 170D are field oxide layers, but the disclosure is not limited thereto. In other embodiment, the isolation structures 170C and 170D are shallow trench structures.

In this embodiment, the doped regions 150B~150D constitute a high-voltage bipolar junction transistor (BJT) Q1. In this case, the structure of the high-voltage BJT Q1 is pnp type. The doped region 150B is served as the base of the high-voltage BJT Q1. The doped region 150C is served as the emitter of the high-voltage BJT Q1. The doped region 150D is served as the collector of the high-voltage BJT Q1. The type of high-voltage BJT Q1 is not limited in the present disclosure. In one embodiment, when the conductivity type of the doped region 150B is N-type and the conductivity types of the doped region 150C and 150D are P-type, the high-voltage BJT Q1 is a pnp transistor.

The well 140E is disposed in the well 140B. the doped region 150H is disposed in the well 140E and has the first conductivity type. In this embodiment, the doped region 150H is a heavily doped region. The doping concentration of the doped region 150H is similar to the doping concentration of the doped region 150D and greater than the doping concentration of the well 140E. The doped region 150I is disposed in the well 140E and has the second conductivity type. In this embodiment, the doped region 150I is a heavily doped region. The doping concentration of the doped region 150I is similar to the doping concentration of the doped region 150B. In one embodiment, the semiconductor structure 100 further comprises an isolation structure 170I. The isolation structure 170I separates the doped region 150H from the doped region 150I. Since the characteristic of the isolation structure 170I is similar to the characteristic of the isolation structure 170C, the related description is omitted here.

In this embodiment, the doped regions 150H and 150I constitute a diode D1. When the conductivity type of the doped region 150H is P-type and the conductivity type of the doped region 150I is n-type, the doped region 150H serves as the anode of the diode D1, and the doped region 150I serves as the cathode of the diode D1.

In some embodiments, the semiconductor structure 100 further comprises interconnect structures 160B and 160C. The interconnect structure 160B is electrically connected to the doped regions 150B and 150H. The interconnect structure 160C is electrically connected to the doped regions 150C and 150I. In this case, the diode D1 is coupled between the emitter and the base of the high-voltage BJT Q1.

In one embodiment, since the doping concentration of the well 140B having the high-voltage BJT Q1 is lower than the doping concentration of the well 140E having the diode D1, the high-voltage BJT Q1 is capable of withstanding a high voltage than the diode D1. Therefore, the high-voltage BJT Q1 is referred to as a high-voltage element, and the diode D1 is referred to as a low-voltage element. In this case, the high-voltage BJT Q1 and the diode D1 constitute a bidirectional power clamp device. In some embodiments, the operation voltage of the low-voltage element is lower than 5V, and the operation voltage of the high-voltage element is higher than 5V.

In other embodiments, the semiconductor structure 100 further comprises a well 140A and a doped region 150A. The well 140A is disposed in the substrate 110 and has a first conductivity type. In this case, the well 140 is a deep high-voltage well. In one embodiment, the doping concentration of the well 140A is less than the doping concentration of the well 140E. The doped region 150A is disposed in the well 140A and has the first conductivity type. In one embodiment, the doped region 150A is a heavily doped region. The doping concentration of the doped region 150A is similar to the doping concentration of the doped region 150C.

In some embodiments, the semiconductor structure 100 further comprises an epitaxial layer 130. The epitaxial layer 130 is disposed on the substrate 110. In one embodiment, the epitaxial layer 130 is formed after the buried layer 120. In this case, the wells 140A and 140B are disposed in the epitaxial layer 130.

In other embodiments, the semiconductor structure 100 further comprises an interconnect structure 160A. The interconnect structure 160A is electrically connected the doped region 150A to the doped region 150D. In this case, the interconnect structure 160A may be coupled to an input output terminal T1, and the interconnect structure 160C may be coupled to another input output terminal T2.

When a first electrostatic discharge (ESD) event occurs at the input output terminal T1 and the input output terminal T2 receives a ground voltage, an first ESD current starts from the input output terminal T1, passes through the well 140B, the doped region 150B, the interconnect structure 160B, the doped region 150H, the well 140E, the doped region 150I, and enters into the doped region 150D. Similarly, when a second ESD event occurs at the input output terminal T2 and the input output terminal T1 receives a ground voltage, a second ESD current stars from the input output terminal T2, passes through the doped region 150C, the wells 140C and 140B, and the doped region 150D, and enters to the input output terminal T1.

In this embodiment, even if the ESD event occurs at the input output terminal T1 or T2, the semiconductor structure 100 is capable of releasing the ESD current. Therefore, the semiconductor structure 100 can be referred to as a bidirectional ESD protection device.

In other embodiments, the semiconductor structure 100 further comprises a high-voltage BJT Q2 to increase the tolerance of the semiconductor structure 100 to withstand the ESD current. The high-voltage BJT Q2 comprises doped regions 150E~150G. The doped region 150E is disposed in the well 140D and has the first conductivity type. In one embodiment, the doped region 150E is served as the emitter of the high-voltage BJT Q2. In this case, the doped region 150E is electrically connected to the doped region 150C via the interconnect structure 160C. In this embodiment, the doped region 150E is a heavily doped region. The doping concentration of the doped region 150E is similar to the doping concentration of the doped region 150C. The well 140D is disposed in the well 140B and has the second conductivity type. The doping concentration of the well 140D is similar to the doping concentration of the well 140C.

The doped region 150F is disposed in the well 140B and has the first conductivity type. In this embodiment, the doped region 150F is a heavily doped region. The doping concentration of the doped region 150F is similar to the doping concentration of the doped region 150E. In one embodiment, the doped region 150E is served as the collector of the high-voltage BJT Q2. In this case, the doped region 150F is electrically connected to the doped region 150D via the interconnect structure 160A.

The doped region 150G is disposed in the well 140B and has the second conductivity type. In one embodiment, the doped region 150G is a heavily doped region. In this case, the doping concentration of the doped region 150G is higher than the doping concentration of the well 140B. In one embodiment, the doped region 150G is served as the vase of the high-voltage BJT Q2. In this case, the doped region 150G is electrically connected to the doped region 150B via the interconnect structure 160B. In some embodiments, the doping concentration of the doped region 150G is similar to the doping concentration of the doped region 150B.

In other embodiments, the doped regions 150G and 150B forms a ring-shape structure. In this case, the doped regions 150C~150F are finger-shape structure and are arranged in sequence in the area surrounded by the doped regions 150G and 150B. In some embodiments, the doped regions 150C and 150D are served as a group. In this case, a plurality of groups are arranged in a sequence in the area surrounded by the doped regions 150G and 150B.

In this embodiment, the emitter of the high-voltage BJT Q1 is electrically connected to the emitter of the high-voltage BJT Q2. The collector of the high-voltage BJT Q1 is electrically connected to the collector of the high-voltage BJT Q2. The base of the high-voltage BJT Q1 is electrically connected to the base of the high-voltage BJT Q2. Therefore, the high-voltage BJT Q1 is connected in parallel to the high-voltage BJT Q2. The number of high-voltage BJTs is not limited in the present disclosure. In other embodiments, the semiconductor structure 100 comprises the more high-voltage BJTs. In this case, all high-voltage BJTs are connected in parallel.

When a first ESD event occurs in the input output terminal T1 and the input output terminal T2 receives a ground voltage, a first ESD current starts from the input output terminal T1, passes through the doped region 150F, the well 140B, the doped region 150G, the interconnect structure 160B, the doped region 150H, the well 140E, the doped region 150I, and enters to the input output terminal T2. Similarly, when a second ESD event occurs in the input output terminal T2 and the input output terminal T1 receives a ground voltage, a second ESD current starts from the input output terminal T2, and passes through the doped region 150E, the wells 140D and 140B, the doped region 150D, and enters to the input output terminal T1.

In some embodiments, the semiconductor structure 100 further comprises isolation structures 170A, 170B, 170E~170H, and 170J. The isolation structure 170A isolates the doped region 150A from the epitaxial layer 130. In this embodiment, the isolation structure 170A overlaps a portion of the well 140A and a portion of the epitaxial layer 130. The isolation structure 170B isolates the doped regions 150A and 150B. In this embodiment, the isolation structure 170B overlaps a portion of the well 140B, a portion of the epitaxial layer 130, and a portion of the well 140A. The isolation structure 170E is disposed between the doped regions 150D and 150E. In this embodiment, the isolation structure 170E overlaps a portion of the well 140D and a portion of the well 140B. The isolation structure 170F is disposed between the doped regions 150E and 150F and overlaps a portion of the well 140B and a portion of the well 140D. The isolation structure 170G is disposed between the doped regions 150F and 150G and overlaps a portion of the well 140B. The isolation structure 170H is disposed between the doped regions 150G and 150H. In this embodiment, the isolation structure 170H overlaps a portion of the well 140E and a portion of the well 140B. The isolation structure 170J isolates the doped region 150I from the epitaxial layer 130. In this embodiment, the isolation structure 170J overlaps a portion of the epitaxial layer 130, a portion of the well 140B, and a portion of the well 140E. Since the characteristics of the isolation structures 170A, 170B, 170E~170H, and 170J are similar to the characteristic of the isolation structure 170C, the related description is omitted here.

Figure 2:
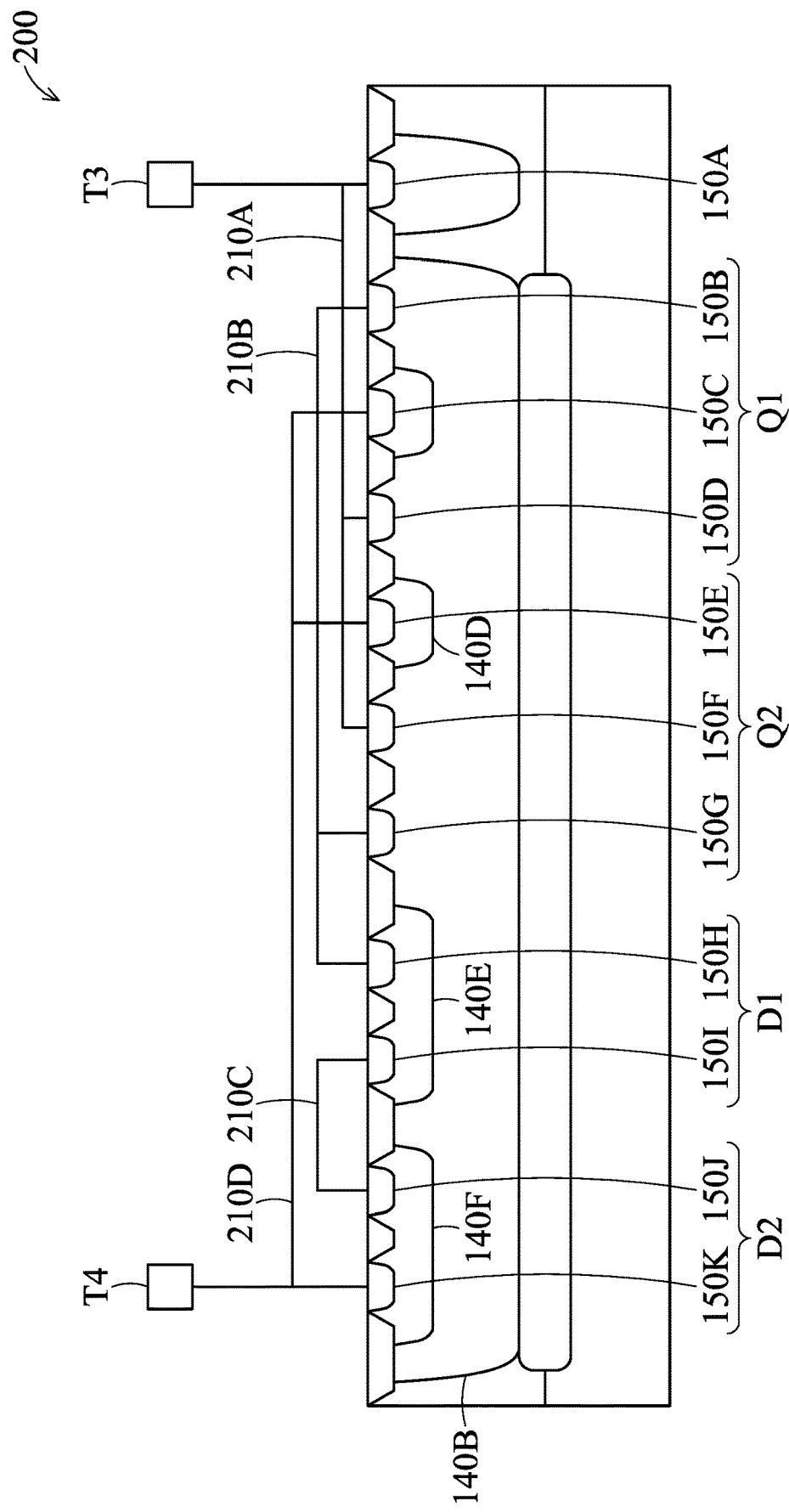
FIG. 2 is a schematic diagram of another exemplary embodiment of the semiconductor structure according to various aspects of the present disclosure.

FIG. 2 is a schematic diagram of another exemplary embodiment of the semiconductor structure according to various aspects of the present disclosure. FIG. 2 is similar to FIG. 1 exception that the semiconductor structure 200 further comprises a diode D1. In this embodiment, the diodes D1 and D2 constitute a diode string. The number of diodes is not limited in the present disclosure. In other embodiments, the semiconductor structure 200 comprises more diodes. For brevity, some symbols already shown in FIG. 1 are omitted in FIG. 2. In FIG. 2, the diode D2 comprises the doped regions 150J and 150K.

The doped region 150J is disposed in the well 140F and has the first conductivity type. The well 140F is disposed in the well 140B and has the first conductivity type. In this embodiment, the doping concentration of the well 140F is similar to the doping concentration of the well 140E. In one embodiment, the doped region 150J is a heavily doped region. The doping concentration of the doped region 150J is similar to the doping concentration of the doped region 150H. The doped region 150K is disposed in the well 140F and has the second conductivity type. In one embodiment, the doped region 150K is a heavily doped region. The doping concentration of the doped region 150K is similar to the doping concentration of the doped region 150I. In one embodiment, when the conductivity type of the doped region 150J is P-type and the conductivity type of the doped region 150K is N-type, the doped region 150J is served as the anode of the diode D2 and the doped region 150K is served as the cathode of the diode D2.

In other embodiments, the semiconductor structure 200 further comprises interconnect structures 210A~210D. The interconnect structure 210A is electrically connected to the input output terminal T3 and the doped regions 150A, 150D, and 150F. The interconnect structure 210B is electrically connected to the doped regions 150B, 150G, and 150H. The interconnect structure 210C is electrically connected to the doped regions 150I and 150J. The interconnect structure 210D is electrically connected to the doped regions 150C, 150E, 150K, and the input output terminal T4.

When a first ESD event occurs in the input output terminal T3 and the input output terminal T4 receives a ground voltage, a first ESD current stars from the input output terminal T3, passes through the doped region 150F, the well 140B, the doped regions 150G and 150H, the well 140E, the doped region 150I, the interconnect structure 210C, the doped region 150J, the well 140F, the doped region 150K, and enters into the input output terminal T4. Similarly, when a second ESD event occurs in the input output terminal T4 and the input output terminal T3 receives a ground voltage, a second ESD current starts from the input output terminal T4, passes through the doped region 150E, the wells 140D and 140B, and the doped region 150D, and enters into the input output terminal T3.

Figure 3A:
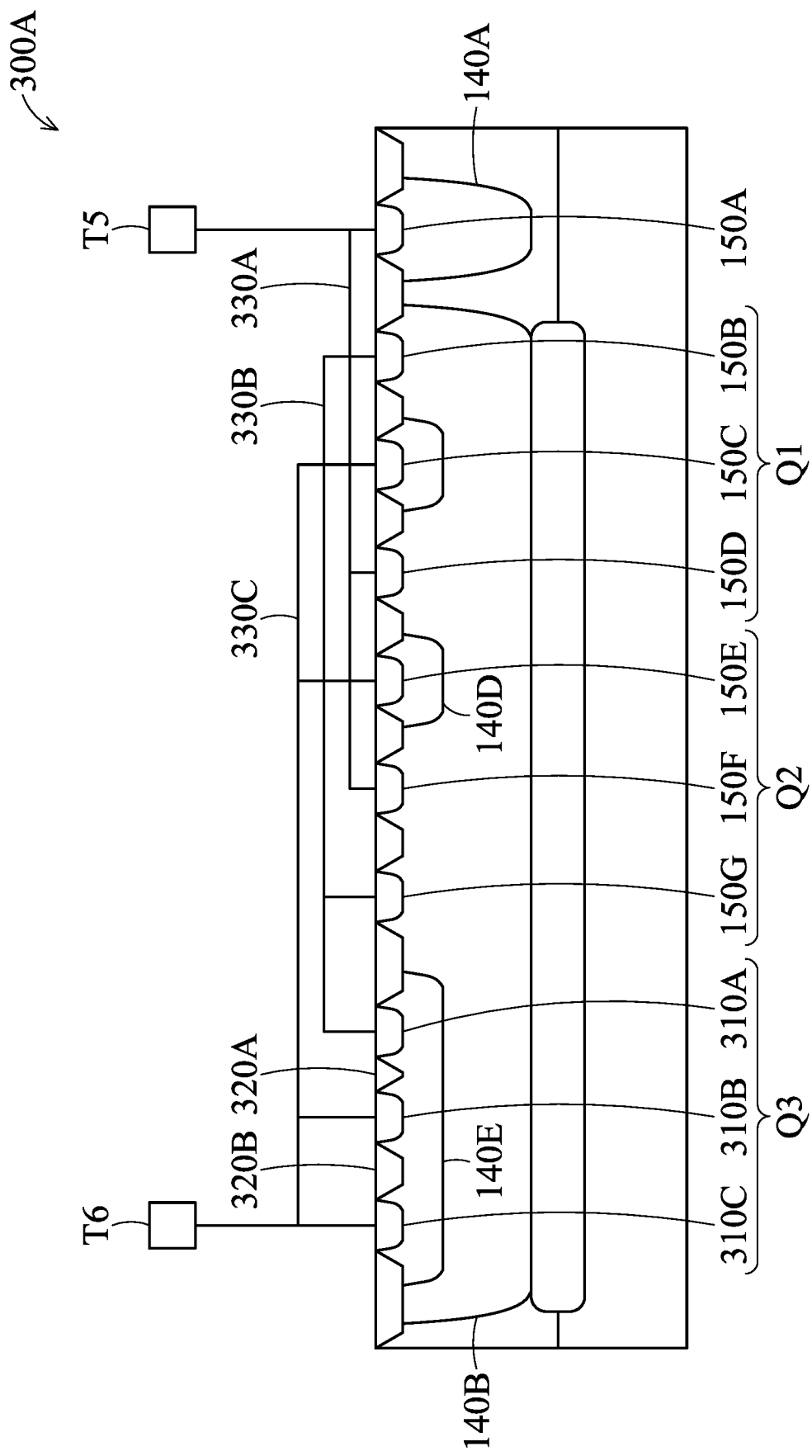
FIGS. 3A-3C are schematic diagrams of other exemplary embodiments of the semiconductor structure according to various aspects of the present disclosure.

FIG. 3A is a schematic diagram of another exemplary embodiment of the semiconductor structure according to various aspects of the present disclosure. FIG. 3A is similar to FIG. 1 with the exception that the semiconductor structure 300A comprises doped regions 310A~310C disposed in the well 140E. To brevity, some symbol already shown in FIG. 1 are omitted in FIG. 3A.

The doped region 310A is disposed in the well 140E and has the second conductivity type. The doping concentration of the doped region 310A is similar to the doping concentration of the doped region 150G. The doped region 310B is disposed in the well 140E and has the second conductivity type. The doping concentration of the doped region 310B is similar to the doping concentration of the doped region 310A. The doped region 310C is disposed in the well 140E and has the first conductivity type. The doping concentration of the doped region 310C is similar to the doping concentration of the doped region 150F. In one embodiment, the doped region 310C is served as the electric contact point.

In some embodiments, the semiconductor structure 300A further comprises isolation structures 320A and 320B. The isolation structure 320A is disposed in the well 140E and separates the doped region 310A from the doped region 310B. The isolation structure 320B is disposed in the well 140E and separates the doped region 310B from doped region 310C. In one embodiment, the isolation structures 320A and 320B are field oxide layers, but the disclosure is not limited thereto. In other embodiments, the isolation structures 320A and 320B are shallow trench structures.

In one embodiment, the doped regions 310A~310C constitute a BJT Q3. In this case, the doped region 310A may be served as the collector of the BJT Q3. The doped region 310B may be served as the emitter of the BJT Q3. The doped region 310C may be served as the base of the BJT Q3. When the conductivity types of the doped regions 310A and 310B are N-type and the conductivity type of the doped region 310C is P-type, the BJT Q3 is a npn transistor.

In other embodiments, the semiconductor structure 300A further comprises isolation structures 330A~330C. The isolation structure 330A is electrically connected to the input output terminal T5 and the doped regions 150A, 150D, and 150F. The isolation structure 330B is electrically connected to the doped regions 150B, 150G, and 310A. The isolation structure 330C is electrically connected to the doped regions 150C, 150E, 310B, 310C, and the input output terminal T6.

When a first ESD event occurs in the input output terminal T5 and the input output terminal T6 receives a ground voltage, a first ESD current starts from the input output terminal T5, passes through the doped region 150F, the well 140B, the doped region 150G, the interconnect structure 330B, the doped region 310A, the well 140E, and the doped region 310B, and enters to the input output terminal T6. Similarly, when a second ESD event occurs in the input output terminal T6 and the input output terminal T5 receives a ground voltage, a second ESD current starts from the input output terminal T6, passes through the doped region 150E, the wells 140D and 140B, and the doped region 150D, and enters into the input output terminal T5.

Figure 3B:
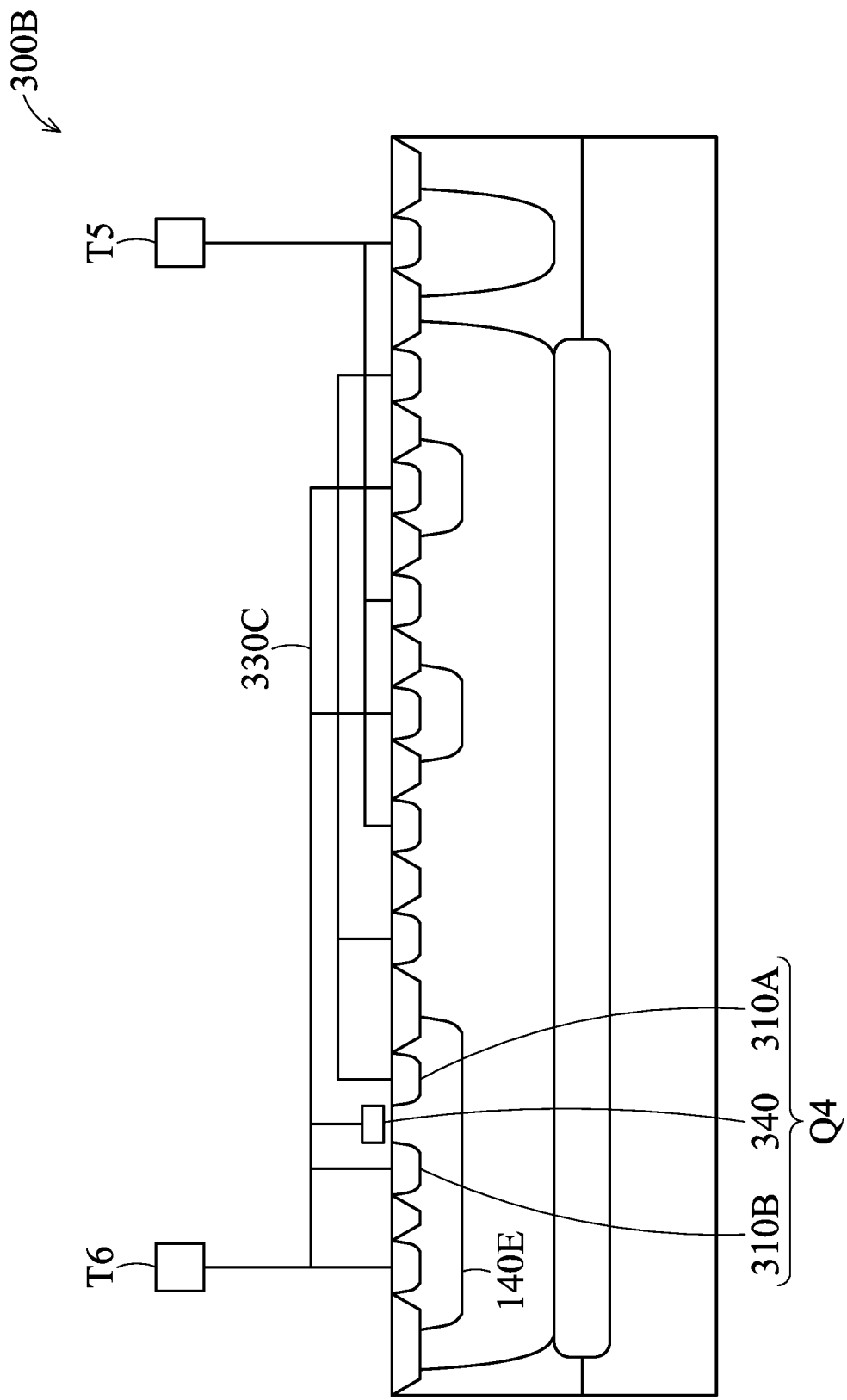

FIG. 3B is a schematic diagram of another exemplary embodiment of the semiconductor structure according to various aspects of the present disclosure. FIG. 3B is similar to FIG. 3A with the exception that the semiconductor structure 300B further comprises a gate structure 340. The gate structure 340 is disposed on the well 140E and disposed between the doped regions 310A and 310B. The gate structure 340 is electrically connected to the interconnect structure 330C. In this embodiment, the gate structure 340, the doped regions 310A and 310B constitute a metal oxide semiconductor (MOS) transistor Q4. There is no isolation structure between the doped regions 310A and 310B. In one embodiment, when the conductivity types of the doped regions 310A and 310B are N-type, the transistor Q4 is referred to as a NMOS transistor. In another embodiment, when the gate structure 340 receives a ground voltage, the transistor Q4 is referred to as a gate-grounded NMOS (ggNMOS) transistor.

Figure 3C:
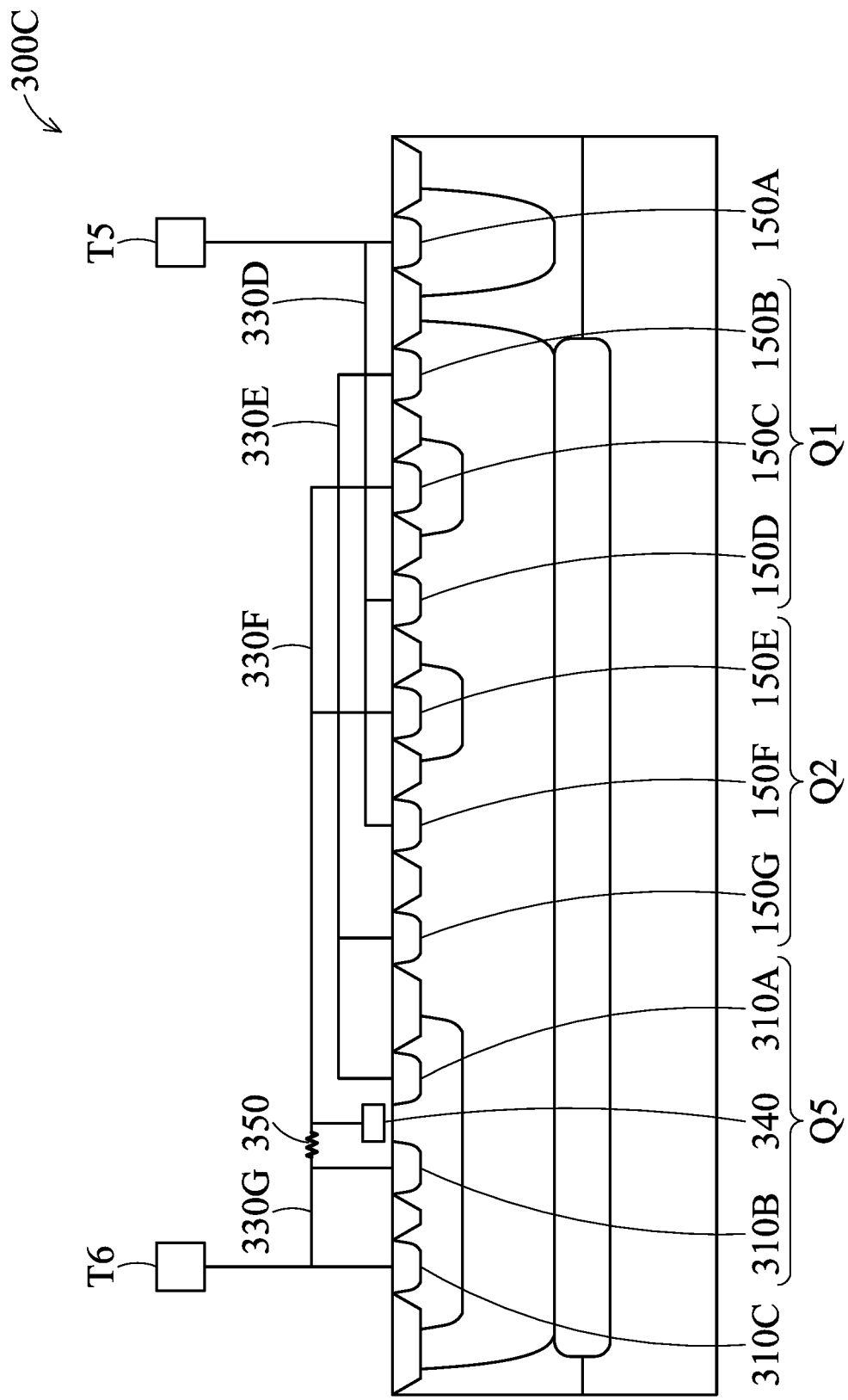

FIG. 3C is a schematic diagram of another exemplary embodiment of the semiconductor structure according to various aspects of the present disclosure. FIG. 3C is similar to FIG. 3B with the exception that the semiconductor structure 300C further comprises a resistor 350. The resistor 350 is coupled between the gate structure 340 and the doped region 310B. In one embodiment, the conductivity types of the doped regions 310A and 310B are N-type. In this case, the gate structure 340, the doped regions 310A and 310B constitute a gate-coupling NMOS (GCNMOS) transistor Q5.

In this embodiment, the semiconductor structure 300C further comprises interconnect structures 330D~330G. The interconnect structure 330D is electrically connected to the input output terminal T5 and the doped regions 150A, 150D, and 150F. The interconnect structure 330E is electrically connected to the doped regions 150B, 150G, and 310A. The interconnect structure 330F is electrically connected to the doped regions 150C and 150E, the gate structure 340, and the resistor 350. The interconnect structure 330G is electrically connected to the resistor 350, the doped regions 310B and 310C, and the input output terminal T6.

Figure 4A:
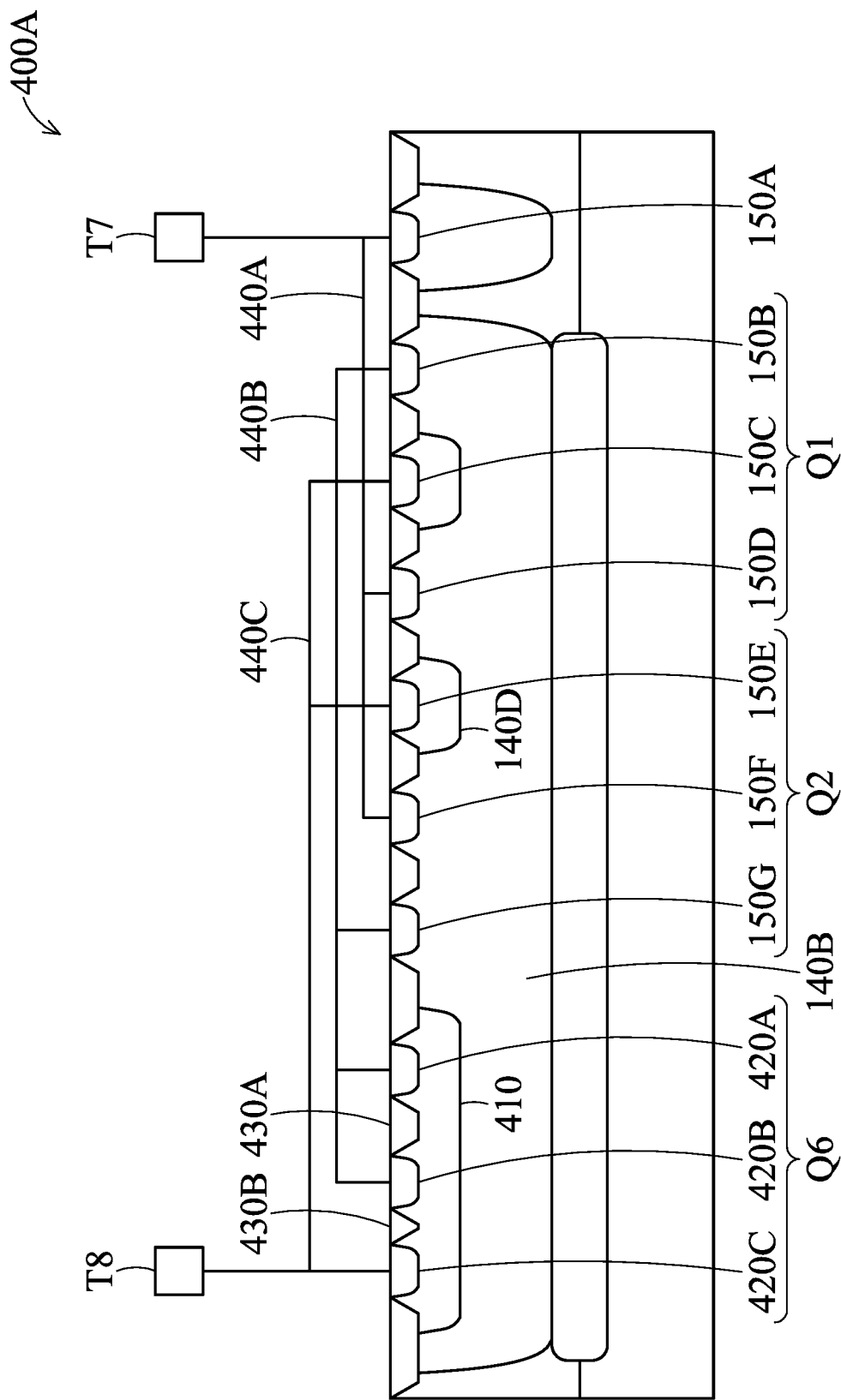
FIGS. 4A-4C are schematic diagrams of other exemplary embodiments of the semiconductor structure according to various aspects of the present disclosure.

FIG. 4A is a schematic diagram of another exemplary embodiment of the semiconductor structure according to various aspects of the present disclosure. FIG. 4A is similar to FIG. 3A with the exception that the conductivity type of the well 410 of the semiconductor structure 400A is different from the conductivity type of the well 140E of the semiconductor structure 300A. To brevity, some symbols in FIG. 4 are omitted because the omitted symbols are shown in FIG. 1.

The well 410 is disposed in the well 140B and has the second conductivity type. In this embodiment, the doping concentration of the well 410 is greater than the doping concentration of the well 140B. In some embodiments, the semiconductor structure 400A further comprises doped regions 420A~420C.

The doped region 420A is disposed in the well 410 and has the second conductivity type. In one embodiment, the doped region 420A is a heavily doped region. The doping concentration of the doped region 420A is greater than the doping concentration of the well 410 and is similar to the doping concentration of the doped region 150G. In this embodiment, the doped region 420A is served as the electrical contact point. The doped region 420B is disposed in the well 410 and has the first conductivity type. In one embodiment, the doped region 420B is a heavily doped region. The doping concentration of the doped region 420B is similar to the doping concentration of the doped region 150F. The doped region 420C is disposed in the well 410 and has the first conductivity type. In one embodiment, the doped region 420C is a heavily doped region. The doping concentration of the doped region 420C is similar to the doping concentration of the doped region 420B.

In other embodiments, the semiconductor structure 400A further comprises isolation structures 430A and 430B. The isolation structure 430A is disposed in the well 410 and isolates the doped region 420A from the doped region 420B. The isolation structure 430B is disposed in the well 410 and isolates the doped region 420B from the doped region 420C. In one embodiment, the characteristics of the isolation structures 430A and 430B are similar to the characteristic of the isolation structure 320A, the related description is omitted here.

In one embodiment, the doped regions 420A~420C compose a BJT Q6. In this case, the doped region 420A may be served as the base of the BJT Q6. The doped region 420B may be served as the emitter of the BJT Q6. The doped region 420C may be served as the collector of the BJT Q6. When the conductivity type of the doped region 420A is N-type and the conductivity types of the doped regions 420B and 420C are P-type, the BJT Q6 is a pnp structure.

In other embodiments, the semiconductor structure 400A further comprises interconnect structures 440A~440C. The interconnect structure 440A is electrically connected to the input output terminal T7 and the doped regions 150A, 150D, and 150F. The interconnect structure 440B is electrically connected to the doped regions 150B, 150G, 420A, and 420B. The interconnect structure 440C is electrically connected to the doped regions 150C, 150E, 420C, and the input output terminal T8.

When a first ESD event occurs in the input output terminal T7 and the input output terminal T8 receives a ground voltage, a first ESD current starts from the input output terminal T7, passes through the doped region 150F, the well 140, the doped region 150G, the interconnect structure 440B, the doped region 420A, the well 410, the doped region 420C, and enters the input output terminal T8. Similarly, when a second ESD event occurs in the input output terminal T8 and the input output terminal T7 receives a ground voltage, a second ESD current starts from the input output terminal T8, passes through the doped region 150E, the wells 140D and 140B, the doped region 150D, and enters to the input output terminal T7

Figure 4B:
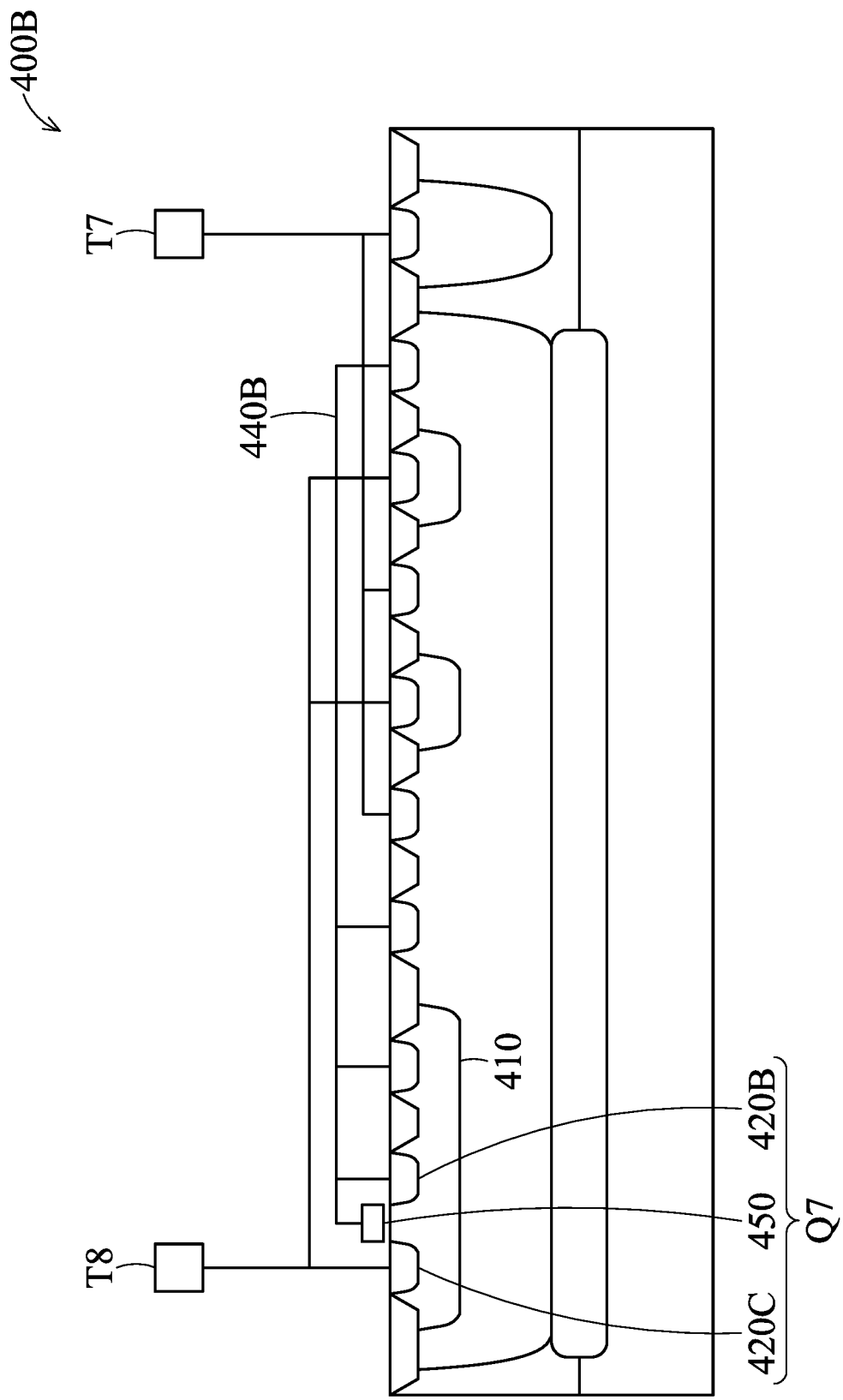

FIG. 4B is a schematic diagram of another exemplary embodiment of the semiconductor structure according to various aspects of the present disclosure. FIG. 4B is similar to FIG. 4A with the exception that the semiconductor structure 400B further comprises a gate structure 450. The gate structure 450 is disposed on the well 410 and between the doped regions 420B and 420C. The gate structure 450 is electrically connected to the interconnect structure 440B. In this embodiment, the gate structure 450, the doped regions 420B and 420C compose a MOS transistor Q7. There is no isolation structure between the doped regions 420B and 420C. In one embodiment, when the conductivity types of the doped regions 420B and 420C are P-type and the conductivity type of the well 410 is N-type, the MOS transistor Q7 is referred to as a PMOS transistor. In another embodiment, when the gate structure 450 receives an operation voltage, the MOS transistor Q7 is referred to as a gated-VDD PMOS (gd PMOS) transistor.

Figure 4C:
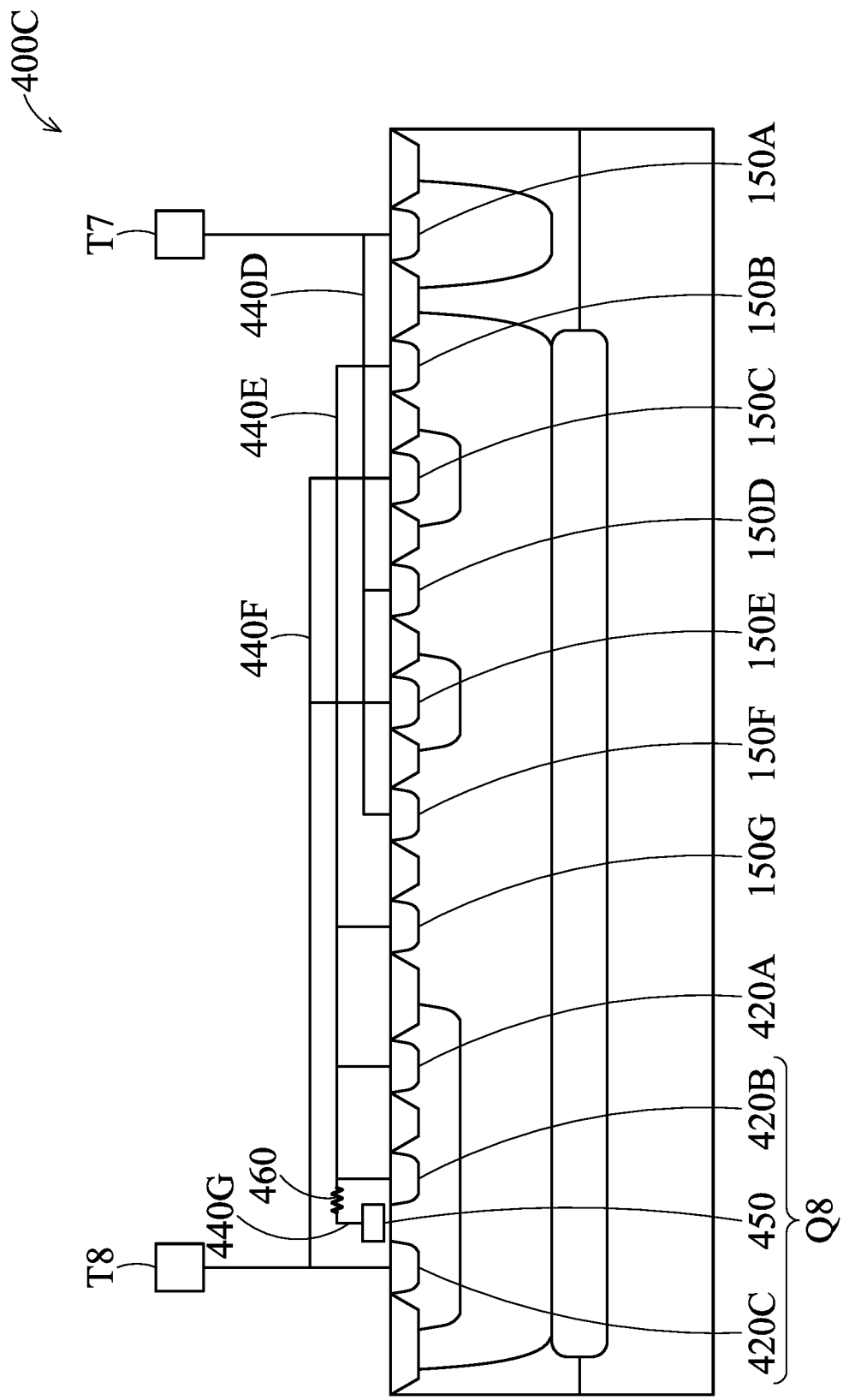

FIG. 4C is a schematic diagram of another exemplary embodiment of the semiconductor structure according to various aspects of the present disclosure. FIG. 4C is similar to FIG. 4B with the exception that the semiconductor structure 400C further comprises a resistor 460. The resistor 460 is coupled between the gate structure 450 and the doped region 420B. In one embodiment, the conductivity types of the doped regions 420B and 420C are P-type. In this case, the gate structure 450, the doped regions 420B and 420C compose a gate-coupling PMOS (GCPMOS) transistor Q8.

In this embodiment, the semiconductor structure 400C further comprises interconnect structures 440D~440G. The interconnect structure 440D is electrically connected to the input output terminal T7 and the doped regions 150A, 150D, and 150E. The interconnect structure 440E is electrically connected to the doped regions 150B, 150G, 420A, 420B, and the resistor 460. The interconnect structure 440F is electrically connected to the doped regions 150C, 150E, 420C, and the input output terminal T8. The interconnect structure 440G is electrically connected to the resistor 460 and the gate structure 450.

Figure 5A:
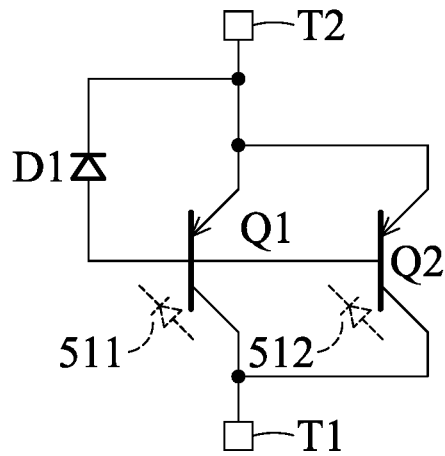
FIG. 5A is an equivalent circuit of the semiconductor structure shown in FIG. 1 according to various aspects of the present disclosure.

FIG. 5A is an equivalent circuit of the semiconductor structure shown in FIG. 1 according to various aspects of the present disclosure. As shown in FIG. 5A, the transistor Q1 is connected in parallel to the transistor Q2. The base (e.g., the doped region 150B of FIG. 1) of the transistor Q1 is electrically connected to the base (e.g., the doped region 150G of FIG. 1) of the transistor Q2. The emitter (e.g., the doped region 150C of FIG. 1) of the transistor Q1 is electrically connected to the emitter (e.g., the doped region 150E of FIG. 1) of the transistor Q2. The collector (e.g., the doped region 150D of FIG. 1) of the transistor Q1 is electrically connected to the collector (e.g., the doped region 150F of FIG. 1) of the transistor Q2. In this embodiment, the first conductivity type is P-type, and the second conductivity type is N-type. Therefore, the transistors Q1 and Q2 are pnp structures.

The diode D1 is coupled between the emitter and the base of the transistor Q1. The cathode of the diode D1 (e.g., the doped region 150I of FIG. 1) is coupled to the emitters of the transistors Q1 and Q2. The anode of the diode D1 (e.g., the doped region 150H of FIG. 1) is coupled to the bases of the transistors Q1 and Q2.

In some embodiments, there is a parasitic diode 511 between the collector and the base of the transistor Q1, and there is a parasitic diode 512 between the collector and the base of the transistor Q2. When a positive ESD event occurs, a first ESD current may start from the input output terminal T2, pass through the emitters, the bases and the collectors of the transistors Q1 and Q2, and enter to the input output terminal T1. When an negative ESD event occurs, a second ESD current may start from the input output terminal T1, pass through the parasitic diodes 511 and 512, the diode D1, and enter to the input output terminal T2. At this time, since the diode D1 is coupled between the emitter and the base of the transistor Q1, the semiconductor structure 100 is capable of withstanding high negative ESD voltage.

Figure 5B:
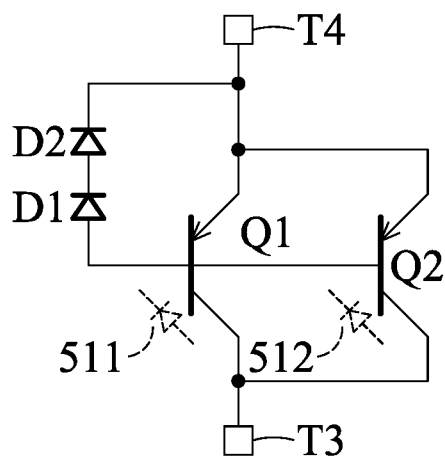
FIG. 5B is an equivalent circuit of the semiconductor structure shown in FIG. 2 according to various aspects of the present disclosure.

FIG. 5B is an equivalent circuit of the semiconductor structure 200 shown in FIG. 2 according to various aspects of the present disclosure. The diode D1 is connected in series to the diode D2 between the emitter and the base of the transistor Q1. In this embodiment, the first conductivity type is P-type, and the second conductivity type is N-type. The anode (e.g., the doped region 150H of FIG. 2) of the diode D1 is coupled to the base (e.g., the doped region 150B of FIG. 2) of the transistor Q1 and the base (e.g., the doped region 150G of FIG. 2) of the transistor Q2. The cathode (e.g., the doped region 150I of FIG. 2) of the diode D1 is coupled to the anode (e.g., the doped region 150J of FIG. 2) of the diode D2. The cathode (e.g., the doped region 150K of FIG. 2) of the diode D2 is coupled to the emitter (e.g., the doped region 150C of FIG. 2) of the transistor Q1 and the emitter (e.g., the doped region 150E of FIG. 2) of the transistor Q2.

When a positive ESD event occurs, a first ESD current starts from the input output terminal T4, passes through the emitters, the bases, and the collectors of the transistors Q1 and Q2, and enters to the input output terminal T3. When an negative ESD event occurs, a second ESD current starts from the input output terminal T3, passes through the parasitic diodes 511 and 512, and the diodes D1 and D2, and enters to the input output terminal T4. In this case, since the diodes D1 and D2 are coupled between the emitter and the collector of the transistor Q1, the semiconductor structure 200 experiences more negative ESD voltage than the semiconductor structure 100. In some embodiment, when the number of diodes between the emitter and the collector of the transistor Q1 is increased, the semiconductor structure 200 is capable of experiencing high negative ESD voltage.

Figure 6A:
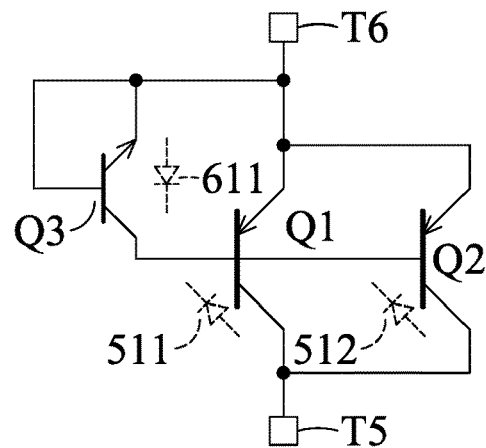
FIG. 6A is an equivalent circuit of the semiconductor structure shown in FIG. 3A according to various aspects of the present disclosure.

FIG. 6A is an equivalent circuit of the semiconductor structure 300A shown in FIG. 3A according to various aspects of the present disclosure. The transistor Q3 is coupled between the emitters and the bases of the transistors Q1 and Q2. In this embodiment, the first conductivity type is P-type, and the second conductivity type is N-type. Therefore, the transistor Q3 belongs to the npn structure.

The emitter (e.g., the doped region 310B of FIG. 3A) of the transistor Q3 and the base (e.g., the doped region 310C of FIG. 3A) of the transistor Q3 are coupled to the input output terminal T6, the emitter (e.g., the doped region 150C of FIG. 3A) of the transistor Q1, and the emitter (e.g., the doped region 150E of FIG. 3A) of the transistor Q2. The collector (e.g., the doped region 310A of FIG. 3A) of the transistor Q3 is coupled to the base (e.g., the doped region 150B of FIG. 3A) of the transistor Q1 and the base (e.g., the doped region 150G of FIG. 3A) of the transistor Q2.

In some embodiments, there is a parasitic diode 611 between the emitter and the collector of the transistor Q3. When a positive ESD event occurs, a first ESD current starts from the input output terminal T6, passes through the emitters, the bases, and the collectors of the transistors Q1 and Q2, and enters the input output terminal T5. When an negative ESD event occurs, a second ESD current starts from the input output terminal T5, passes through the parasitic diodes 511, 512, and 611, and enters to the input output terminal T6. Since the parasitic diode 611 has a large reverse breakdown voltage, the semiconductor structure 300A can withstand a large negative ESD voltage.

Figure 6B:
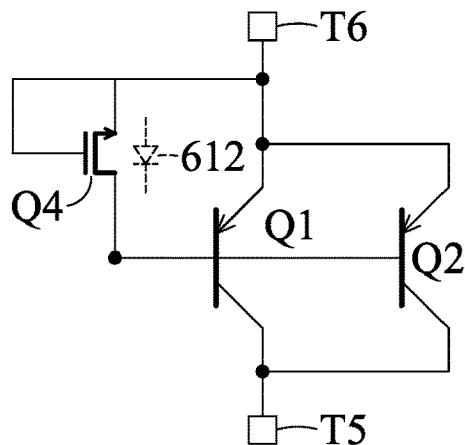
FIG. 6B is an equivalent circuit of the semiconductor structure shown in FIG. 3B according to various aspects of the present disclosure.

FIG. 6B is an equivalent circuit of the semiconductor structure 300B shown in FIG. 3B according to various aspects of the present disclosure. As shown in FIG. 6B, the transistors Q4 is coupled between the emitters and the bases of the transistors Q1 and Q2. In this embodiment, the first conductivity type is P-type, and the second conductivity type is N-type. Therefore, the transistor Q4 belongs to NMOS transistor.

The source (e.g., the doped region 310B of FIG. 3B) of the transistor Q4 and the gate (e.g., the gate structure 340 of FIG. 3B) of the transistor Q4 are coupled to the input output terminal T6 and the emitter of the transistor Q1. The drain (e.g., the doped region 310A of FIG. 3B) of the transistor Q4 is coupled to the base of the transistor Q1. In some embodiments, there is a parasitic diode 612 between the source and the drain of the transistor Q4. Since the reverse breakdown voltage of the parasitic diode 612 is about 8V~9V, the semiconductor structure 300B can withstand a large negative ESD voltage.

Figure 6C:
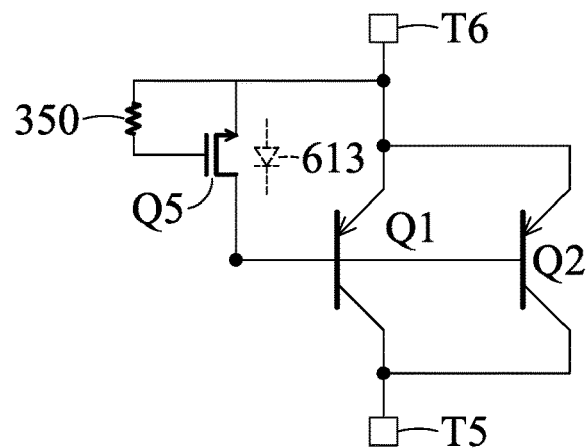
FIG. 6C is an equivalent circuit of the semiconductor structure shown in FIG. 3C according to various aspects of the present disclosure.

FIG. 6C is an equivalent circuit of the semiconductor structure 300C shown in FIG. 3C according to various aspects of the present disclosure. As shown in FIG. 6C, the transistor Q5 is coupled between the emitter and the base of the transistor Q1. The resistor 350 is coupled between the gate and the source of the transistor Q5. In this embodiment, the first conductivity type is P-type, and the second conductivity type is N-type. Therefore, the transistor Q5 belongs to NMOS transistor.

The source (e.g., the doped region 310B of FIG. 3C) of the transistor Q5 is coupled to the input output terminal T6 and the emitter Q1. The drain (e.g., the doped region 310A of FIG. 3C) of the transistor Q5 is coupled to the transistor Q1. The resistor 350 is coupled between the source and the gate (e.g., the gate structure 340 of FIG. 3C) of the transistor Q5. In some embodiments, there is a parasitic diode 613 between the source and the drain of the transistor Q5.

Figure 7A:
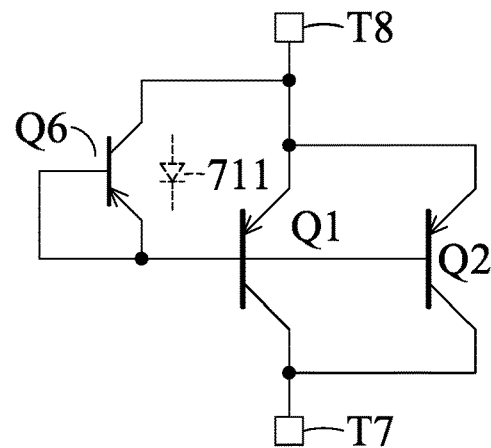
FIG. 7A is an equivalent circuit of the semiconductor structure shown in FIG. 4A according to various aspects of the present disclosure.

FIG. 7A is an equivalent circuit of the semiconductor structure 400A shown in FIG. 4A according to various aspects of the present disclosure. As shown in FIG. 7A, the transistor Q6 is coupled between the emitters and the bases of the transistors Q1 and Q2. In this embodiment, the first conductivity type is P-type, and the second conductivity type is N-type. Therefore, the transistor Q6 belongs to pnp structure.

The collector (e.g., the doped region 420C of FIG. 4A) of the transistor Q6 is coupled to the emitter (e.g., the doped region 150C of FIG. 4A) of the transistor Q1 and the emitter (e.g., the doped region 150E of FIG. 4A) of the transistor Q2. The emitter (e.g., the doped region 420B of FIG. 4A) of the transistor Q6 and the base (e.g., the doped region 420A of FIG. 4A) of the transistor Q6 are coupled to the base (e.g., the doped region 150B of FIG. 4A) of the transistor Q1. In some embodiments, there is a parasitic diode 711 between the emitter and the collector of the transistor Q6.

Figure 7B:
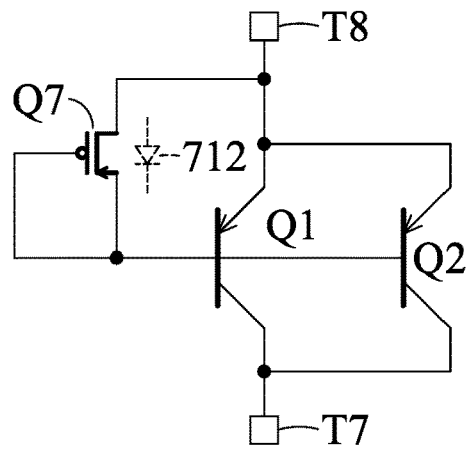
FIG. 7B is an equivalent circuit of the semiconductor structure shown in FIG. 4B according to various aspects of the present disclosure.

FIG. 7B is an equivalent circuit of the semiconductor structure 400B shown in FIG. 4B according to various aspects of the present disclosure. As shown in FIG. 7B, the transistor Q7 is coupled to the emitter and the base of the transistor Q1. In this embodiment, the first conductivity type is P-type, and the second conductivity type is N-type. Therefore, the transistor Q7 belongs to PMOS transistor.

The drain (e.g., the doped region 420C of FIG. 4B) of the transistor Q7 is coupled to the emitter of the transistor Q1 and the input output terminal T8. The source (e.g., the doped region 420B of FIG. 4B) of the transistor Q7 and the gate (e.g., the gate structure 450 of FIG. 4B) of the transistor Q7 are coupled to the base of the transistor Q1. In some embodiments, there is a parasitic diode 712 between the drain and the source of the transistor Q7.

Figure 7C:
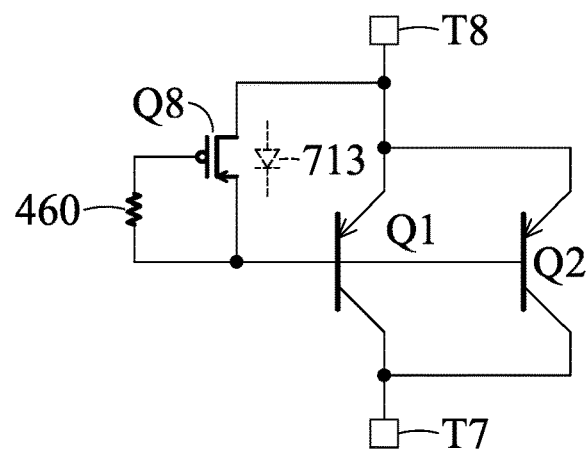
FIG. 7C is an equivalent circuit of the semiconductor structure shown in FIG. 4C according to various aspects of the present disclosure.

FIG. 7C is an equivalent circuit of the semiconductor structure 400C shown in FIG. 4C according to various aspects of the present disclosure. As shown in FIG. 7C, the transistor Q8 is coupled between the emitter and the base of the transistor Q1. The resistor 460 is coupled between the gate and the source of the transistor Q8. In this embodiment, the first conductivity type is P-type, and the second conductivity type is N-type. Therefore, the transistor Q8 belongs to a PMOS transistor.

The drain (e.g., the doped region 420C of FIG. 4C) of the transistor Q8 is coupled to the emitter of the transistor Q1 and the input output terminal T8. The source (e.g., the doped region 420B of FIG. 4C) of the transistor Q8 is coupled to the base of the transistor Q1. The resistor 460 is coupled between the source and the gate (e.g., the gate structure 450 of FIG. 4C) of the transistor Q8. In some embodiments, there is a parasitic diode 713 between the source and the drain of the transistor Q8.

Figure 8A:
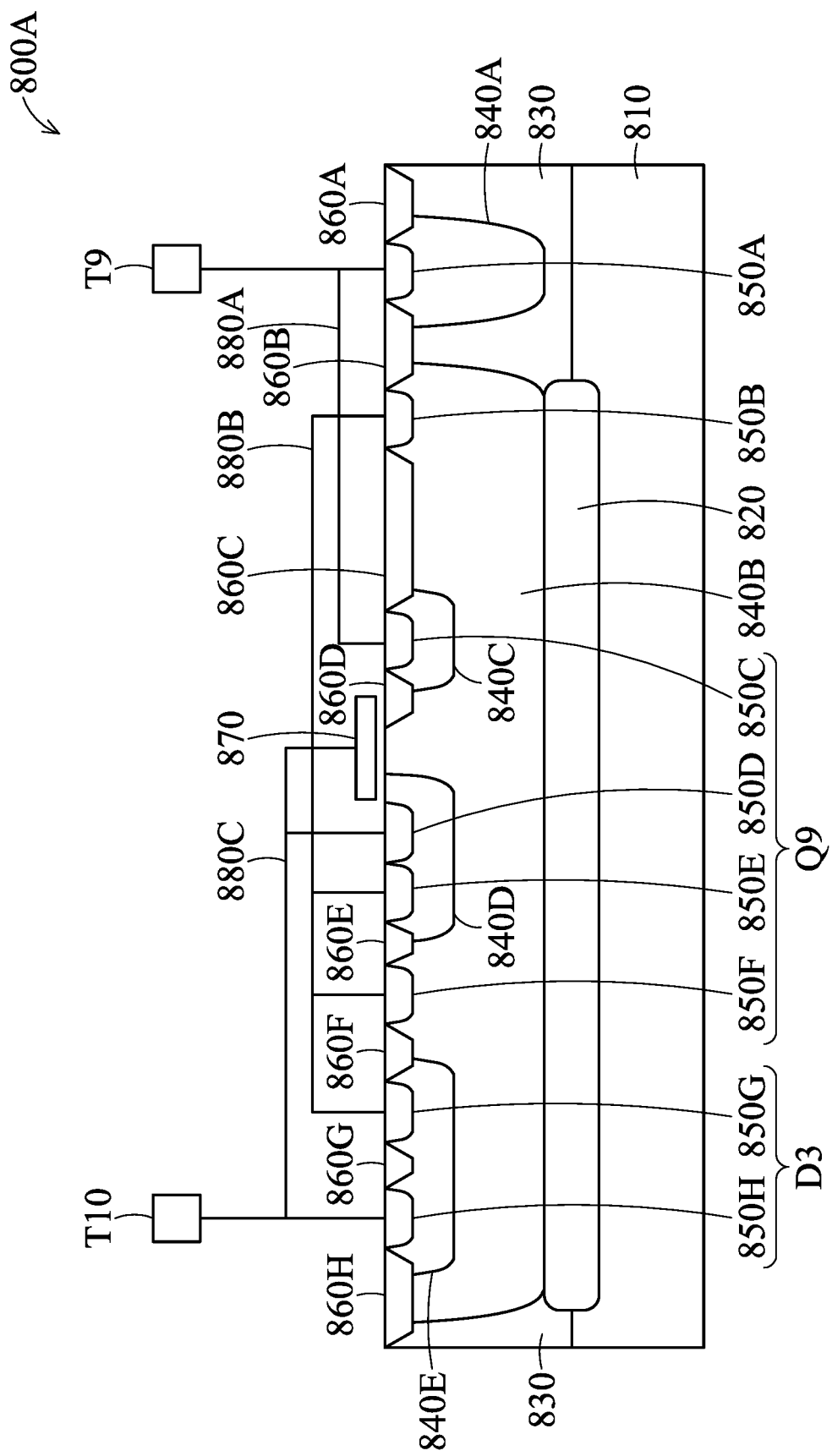
FIGS. 8A and 8B are schematic diagrams of other exemplary embodiments of the semiconductor structure according to various aspects of the present disclosure.

The structures of transistors Q1 and Q2 are not limited in the present disclosure. FIG. 8A is a schematic diagram of another exemplary embodiment of the semiconductor structure according to various aspects of the present disclosure. The semiconductor structure 800A comprises a substrate 810, wells 840B, 840D and 840E, and doped regions 850B~850H. The substrate 810 has the first conductivity type. In one embodiment, substrate 810 is a silicon substrate, a semiconductor-on-insulator (SOI) substrate, or another suitable semiconductor substrate.

The well 840B is disposed in the substrate 810 and has the second conductivity type. In one embodiment, the well 840B is a deep high-voltage well. Since the characteristic of the well 840B shown in FIG. 8A is similar to the characteristic of the well 140B shown in FIG. 1, the related description is omitted here. In other embodiments, the semiconductor structure 800A further comprises a buried layer 820 and an epitaxial layer 830. The buried layer 820 is disposed on the substrate 810 and has the second conductivity type. The buried layer 820 separates the substrate 810 from the well 840B. The epitaxial layer 830 is disposed on the substrate 810. In one embodiment, the epitaxial layer 830 is formed after the buried layer 820.

The well 840D is disposed in the well 840B and has the second conductivity type. In one embodiment, the doping concentration of the well 840D is higher than the doping concentration of the well 840B. The well 840E is disposed in the well 840B and has the first conductivity type. In other embodiments, the semiconductor structure 800A further comprises a well 840A. The well 840A is disposed in the epitaxial layer 830 and has the first conductivity type. The well 840A is a deep high-voltage well. In one embodiment, the doping concentration of the well 840A is lower than the doping concentration of the well 840E.

The doped regions 850B and 850F are disposed in the well 840B and have the second conductivity type. In one embodiment, each of the doped regions 850B and 850F is a heavily doped region. In this case, the doping concentration of the doped region 850B is similar to the doping concentration of the doped region 850F and higher than the doping concentration of the well 840D. In other embodiments, the doped regions 850B and 850F form a ring-shape structure.

The doped region 850C is disposed in the well 840B and has the first conductivity type. In this embodiment, the doped region 850C is a heavily doped region. In other embodiments, the semiconductor structure 800A further comprises a well 840C. The well 840C is disposed in the well 840B and has the first conductivity type. The doped region 850C is disposed in the well 840C. In this case, the doping concentration of the doped region 850C is higher than the doping concentration of the well 840C.

The doped regions 850D and 850E are disposed in the well 840D. The doped region 850D has the first conductivity type. The doping concentration of the doped region 850D is similar to the doping concentration of the doped region 850C. The doped region 850E has the second conductivity type. In this embodiment, each of the doped regions 850D and 850E is a heavily doped region. The doping concentration of the doped region 850E is similar to the doping concentration of the doped region 850F and higher than the doping concentration of the well 840D.

In this embodiment, the doped regions 850C, 850D and 850F constitute a high-voltage BJT Q9. In this case, the high-voltage BJT Q9 belongs to pnp structure. The doped region 850C is served as the collector of the high-voltage BJT Q9. The doped region 850D is served as the emitter of the high-voltage BJT Q9. The doped region 850F is served as the base of the high-voltage BJT Q9.

The doped regions 850G and 850H are disposed in the well 840E. The doped region 850G has the first conductivity type, and the doped region 850H has the second conductivity type. In this embodiment, the doped regions 850G and 850H are heavily doped regions. The doping concentration of the doped region 850G is similar to the doping concentration of the doped region 850D and higher than the doping concentration of the well 840E. The doping concentration of the doped region 850H is similar to the doping concentration of the doped region 850F. In this embodiment, the doped regions 850G and 850H serve as a diode D3. When the conductivity type of the doped region 850G is P-type and the conductivity type of the doped region 850H is N-type, the doped region 850G is served as the anode of the diode D3 and the doped region 850H is served as the cathode of the diode D3. In some embodiments, the semiconductor structure 800A further comprises isolation structure 860G. The isolation structure 860G separates the doped region 850G from the doped region 850H.

In other embodiments, the semiconductor structure 800A further comprises a well 840A and a doped region 850A. The well 840A is disposed in the epitaxial layer 830 and has the first conductivity type. In this case, the well 840A is a deep high-voltage well. In this case, the doping concentration of the well 840A is lower than the doping concentration of the well 840C. The doped region 850A is disposed in the well 840A and has the first conductivity type. In one embodiment, the doped region 850A is a heavily doped region. The doping concentration of the doped region 850A is similar to the doping concentration of the doped region 850C.

In some embodiment, the semiconductor structure 800A further comprises isolation structures 860A~860H. The isolation structure 860A overlaps a portion of the well 840A and a portion of the epitaxial layer 830. The isolation structure 860B isolates the doped regions 850A and 850B and overlaps a portion of the well 840B, a portion of the epitaxial layer 830, and a portion of the well 840A. The isolation structure 860C isolates the doped regions 850B and 850C and overlaps a portion of the well 840C and a portion of the well 840B. The isolation structure 860D is disposed between the doped regions 850C and 850D and overlaps a portion of the well 840B and a portion of the well 840C. The isolation structure 860E isolates the doped regions 850E and 850F and overlaps a portion of the well 840B and a portion of the well 840D. The isolation structure 860F isolates the doped regions 850F and 850G and overlaps a portion of the well 840B and a portion of the well 840E. The isolation structure 860G isolates the doped regions 850G and 850H and is disposed in the well 840E. The isolation structure 860H is adjacent the doped region 850H and overlaps a portion of the epitaxial layer 830, a portion of the well 840B, and a portion of the well 840E. In one embodiment, the isolation structures 860A~860H are field oxide layers, but the disclosure is not limited thereto. In other embodiment, the isolation structures 860A~860H are shallow trench structures.

In this embodiment, the semiconductor structure 800A further comprises a gate structure 870. The gate structure 870 is disposed on the well 840B and between the doped regions 850C and 850D. There is a gap between the gate structure 870 and doped region 850C. The gate structure 870 overlaps a portion of the well 840D, a portion of the well 840B, and a portion of the isolation structure 860D.

In some embodiment, the semiconductor structure 800A further comprises interconnect structures 880A~880C. The interconnect structure 880A is electrically connected to the input output terminal T9, and the doped regions 850A and 850C. The interconnect structure 880B is electrically connected to the doped regions 850B, 850E, 850F, and 850G. The interconnect structure 880C is electrically connected to the gate structure 870, the doped regions 850D and 850H, and the input output terminal T10. In this embodiment, the diode D3 is coupled between the emitter and the base of the high-voltage BJT Q9.

In other embodiments, the equivalent circuit of the semiconductor structure 800A is similar to the equivalent circuit shown in FIG. 5A. In this case, the transistor Q9 shown in FIG. 8A is served as the transistor Q1 shown in FIG. 5A, and the diode D3 shown in FIG. 8A is served as the diode D1 shown in FIG. 5A.

Figure 8B:
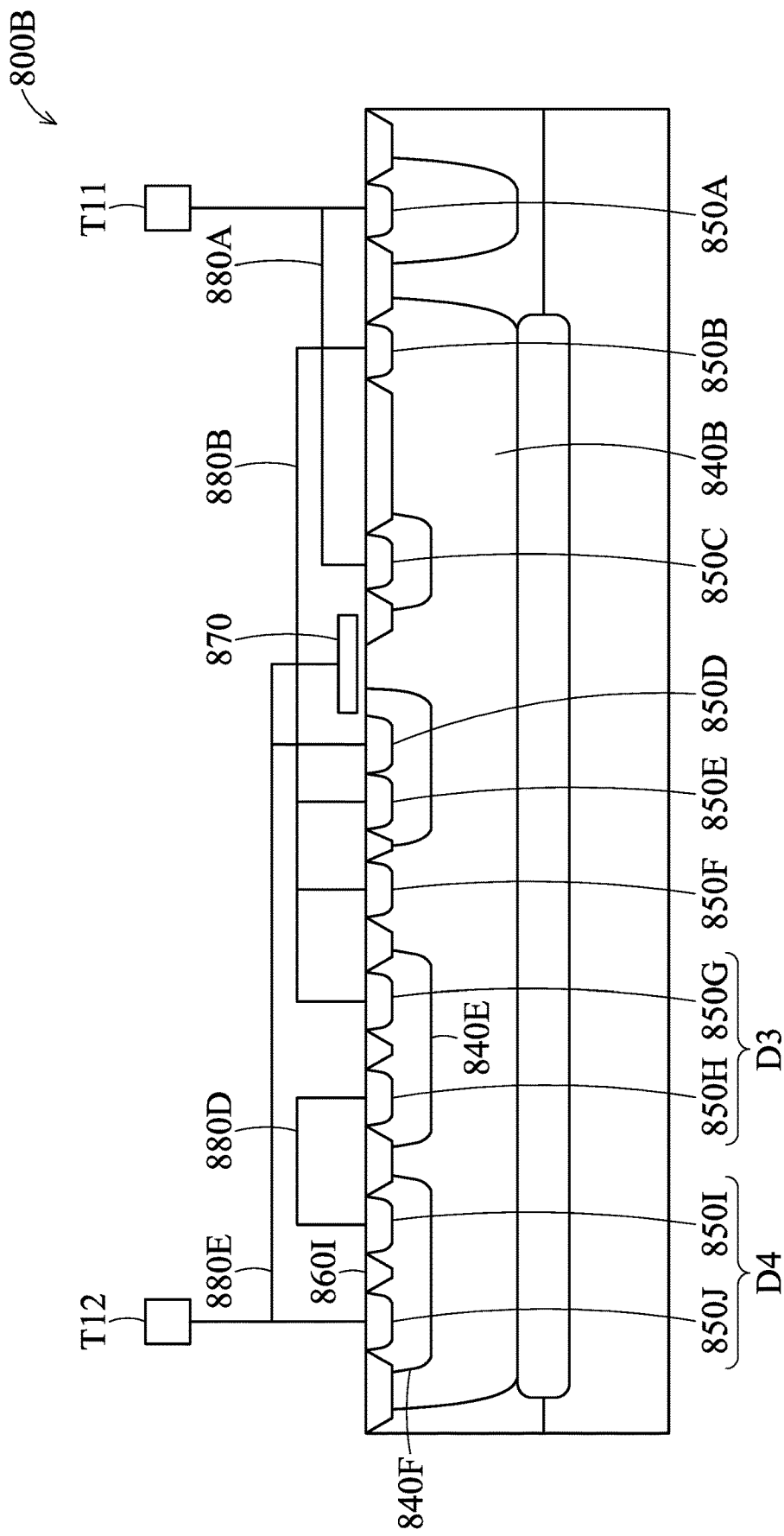

FIG. 8B is a schematic diagram of another exemplary embodiment of the semiconductor structure according to various aspects of the present disclosure. FIG. 8B is similar to FIG. 8A exception that the semiconductor structure 800B further comprises well 840F, and the doped regions 850I and 850J. The well 840F is disposed in the well 840B and has the first conductivity type. In one embodiment, the doping concentration of the well 840F is similar to the doping concentration of the well 840E.

The doped regions 850I and 850J are disposed in the well 840F. The doped region 850I has the first conductivity type and the doped region 850J has the second conductivity type. In this embodiments, each of the doped regions 850I and 850J is a heavily doped region. The doping concentration of the doped region 850I is similar to the doping concentration of the doped region 850G and higher than the doping concentration of the well 840F. The doping concentration of the doped region 850J is similar to the doping concentration of the doped region 850H. In this embodiment, the doped regions 850I and 850J serve as a diode D4. When the conductivity type of the doped region 850I is P-type and the conductivity type of the doped region 850J is N-type, the doped region 850I is served as the anode of the diode D4 and the doped region 850J is served as the cathode of the diode D4. In some embodiments, the semiconductor structure 800B further comprises an isolation structure 860I. The isolation structure 860I separates the doped region 850I from the doped region 850J.

In this embodiment, the semiconductor structure 800B further comprises interconnect structures 880A, 880B, 880D, and 880E. The interconnect structure 880a is electrically connected to the input output terminal T11, the doped region 850A, and the doped region 850C. The interconnect structure 880B is electrically connected to the doped regions 850B, 850E, 850F, and 850G. The interconnect structure 880D is electrically connected to the doped regions 850H and 850I. The interconnect structure 880E is electrically connected to the gate structure 870, the doped region 850D, the doped region 850J, and the input output terminal T12. In this embodiment, the diode D3 is connected in series to the diode D4 between the emitter and the base of the high-voltage BJT Q9.

In other embodiments, the equivalent circuit of the semiconductor structure 800B is similar to the equivalent circuit shown in FIG. 5B. In this case, the diodes D3 and D4 shown in FIG. 8B are served as the diodes D1 and D2 shown in FIG. 5B, respectively.

Figure 9A:
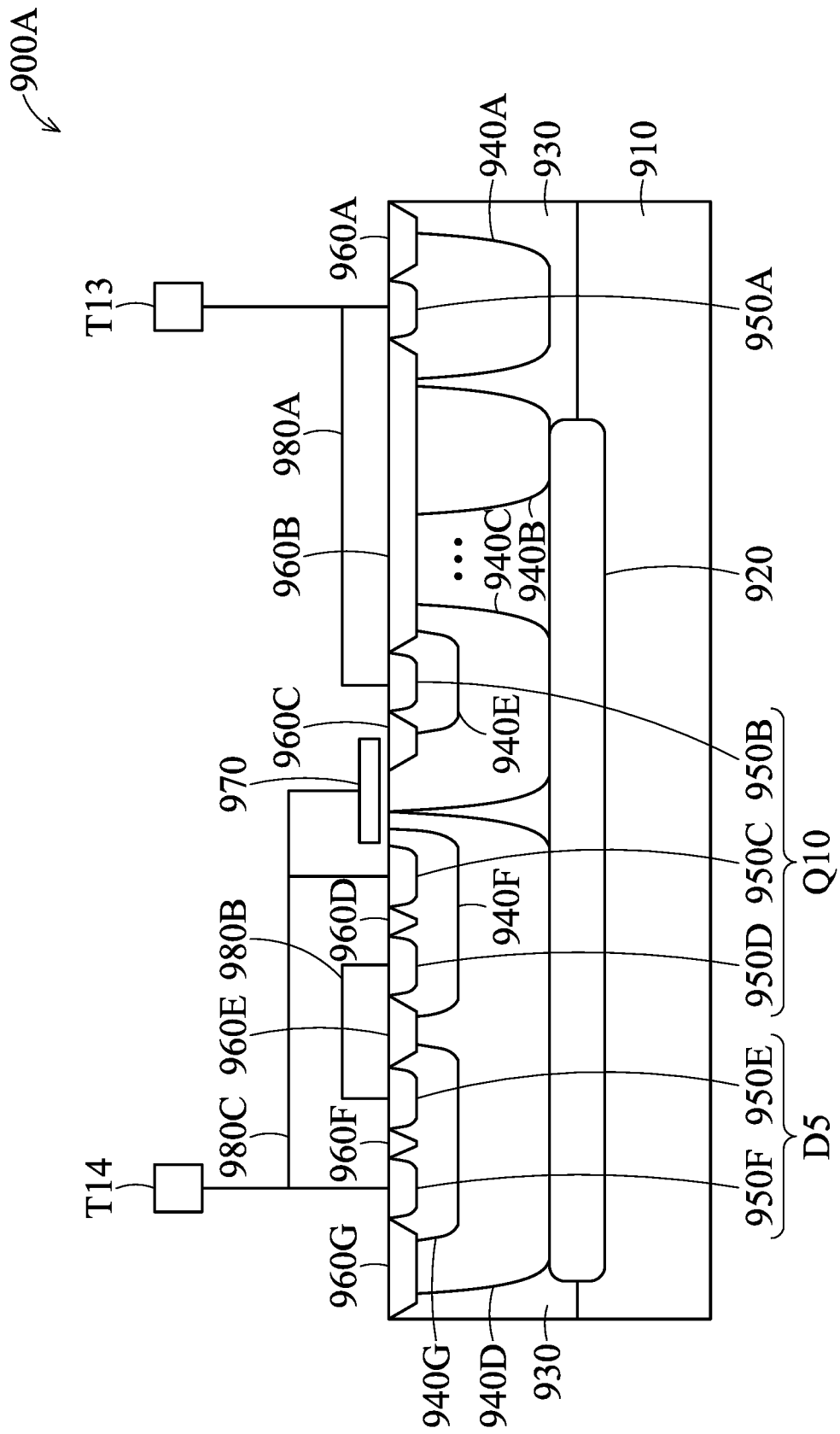
FIGS. 9A and 9B are schematic diagrams of other exemplary embodiments of the semiconductor structure according to various aspects of the present disclosure.

FIG. 9A is a schematic diagram of another exemplary embodiment of the semiconductor structure according to various aspects of the present disclosure. The semiconductor structure 900A comprises a substrate 910, wells 940C~940G, and doped regions 950B~950F. The substrate 910 has the first conductivity type. Since the characteristic of the substrate 910 shown in FIG. 9A is similar to the characteristic of the substrate 110 shown in FIG. 1, the related description is omitted here.

In other embodiments, the semiconductor structure 900A further comprises a buried layer 920 and an epitaxial layer 930. The buried layer 920 is disposed on the substrate 910 and has the second conductivity type. The epitaxial layer 930 is disposed on the substrate 910 and the buried layer 920. In one embodiment, the epitaxial layer 930 is formed after the buried layer 920.

The wells 940C and 940D are disposed in the epitaxial layer 930. The well 940C has the first conductivity type, and the well 940D has the second conductivity type. In one embodiment, the wells 940C and 940D are deep high-voltage wells. The wells 940F and 940G are disposed in the well 940D. The well 940F has the second conductivity type, and the well 940G has the first conductivity type. In this embodiment, the doping concentration of the well 940F is higher than the doping concentration of the well 940D, and the doping concentration of the well 940G is higher than the doping concentration of the well 940C.

The doped region 950B is disposed in the well 940C and has the first conductivity type. In this embodiment, the doped region 950B is a heavily doped region. In other embodiments, the semiconductor structure 900A further comprises a well 940E. The well 940E is disposed in the well 940C and has the first conductivity type. The doped region 950B is disposed in the well 940E. In this case, the doping concentration of the doped region 950B is higher than the doping concentration of the well 940E, and the doping concentration of the well 940E is higher than the doping concentration of the well 940C.

The doped regions 950C and 950D are disposed in the well 940F. The doped region 950C has the first conductivity type, and the doped region 950D has the second conductivity type. In one embodiment, each of the doped regions 950C and 950D is a heavily doped region. The doping concentration of the doped region 950C is similar to the doping concentration of the doped region 950B, and the doping concentration of the doped region 950D is higher than the doping concentration of the well 940F. In some embodiments, the semiconductor structure 900A further comprises an isolation structure 960D. The isolation structure 960D is disposed in the well 940F and separates the doped region 950C from the doped region 950D.

In this embodiment, the doped regions 950B~950D constitute a high-voltage BJT Q10. The doped region 950B is served as the collector of the high-voltage BJT Q10. The doped region 950C is served as the emitter of the high-voltage BJT Q10. The doped region 950D is served as the base of the high-voltage BJT Q10.

The doped regions 950E and 950f are disposed in the well 940G. The doped region 950E has the first conductivity type, and the doped region 950F has the second conductivity type. In this embodiment, each of the doped regions 950E and 950F is a heavily doped region. The doping concentration of the doped region 950E is similar to the doping concentration of the doped region 950C and higher than the doping concentration of the well 940G. The doping concentration of the doped region 950F is similar to the doping concentration of the doped region 950D.

In this embodiment, the doped regions 950E and 950F serve as a diode D5. When the conductivity type of the doped region 950E is P-type and the conductivity type of the doped region 950F is N-type, the doped region 950E is served as the anode of the diode D5 and the doped region 950F is served as the cathode of the diode D5. In some embodiments, the semiconductor structure 900A further comprises an isolation structure 960F. The isolation structure 960F separates the doped region 950E and 950F.

In other embodiments, the semiconductor structure 900A further comprises wells 940A and 940B, and a doped region 950A. The well 940A is disposed in the epitaxial layer 930 and has the first conductivity type. In this case, the well 940A is a deep high-voltage well. The doping concentration of the well 940A is similar to the doping concentration of the well 940C. The doped region 950A is disposed in the well 940A and has the first conductivity type. In one embodiment, the doped region 950A is a heavily doped region. The doping concentration of the doped region 950A is similar to the doping concentration of the doped region 950B. The well 940B is disposed in the epitaxial layer 930 and has the second conductivity type. In this case, the well 940B is a deep high-voltage well. The doping concentration of the well 940B is similar to the doping concentration of the well 940D.

In some embodiments, the semiconductor structure 900A further comprises isolation structures 960A~960C and 960G. The isolation structure 960A is adjacent the doped region 950A and overlaps a portion of the well 940A and a portion of the epitaxial layer 930. The isolation structure 960B separates the doped region 950A from the doped region 950B and overlaps a portion of the well 940E, a portion of the well 940C, a portion of the epitaxial layer 930, the well 940B, and a portion of the well 940A. The isolation structure 960C is disposed between the doped regions 950B and 950C and overlaps a portion of the well 940C and a portion of the well 940E. The isolation structure 960E separates the doped region 950D from the doped region 950E and overlaps a portion of the well 940G, a portion of the well 940D, and a portion of the well 940F. The isolation structure 960G is adjacent the doped region 950F and overlaps a portion of the epitaxial layer 930, a portion of the well 940D and a portion of the 940G. In one embodiment, the isolation structures 960A~960G are field oxide layers, but the disclosure is not limited thereto. In other embodiment, the isolation structures 960A~960G are shallow trench structures.

In this embodiment, the semiconductor structure 900A further comprises a gate structure 970. The gate structure 970 is disposed between the doped regions 950B and 950C. There is a gap between the gate structure 970 and the doped region 950B. The gate structure 970 overlaps a portion of the well 940F, a portion of the well 940D, a portion of the well 940C, and a portion of the isolation structure 960C.

In some embodiments, semiconductor structure 900A further comprises interconnect structures 980A~980C. The interconnect structure 980A is electrically connected to the input output terminal T13, the doped region 950A, and the doped region 950B. The interconnect structure 980B is electrically connected to the doped regions 950D and 950E. The interconnect structure 980C is electrically connected to the gate structure 970, the doped regions 950C, 950F, and the input output terminal T14. In this embodiment, the diode D5 is coupled between the emitter and the base of the high-voltage BJT Q10.

In other embodiments, the equivalent circuit of the semiconductor structure 900A of FIG. 9A is similar to the equivalent circuit shown in FIG. 5A. In this case, the high-voltage BJT Q10 of FIG. 9A is served as the transistor Q1 of FIG. 5A, and the diode D5 of FIG. 9A is served as the diode D1 of FIG. 5A.

Figure 9B:
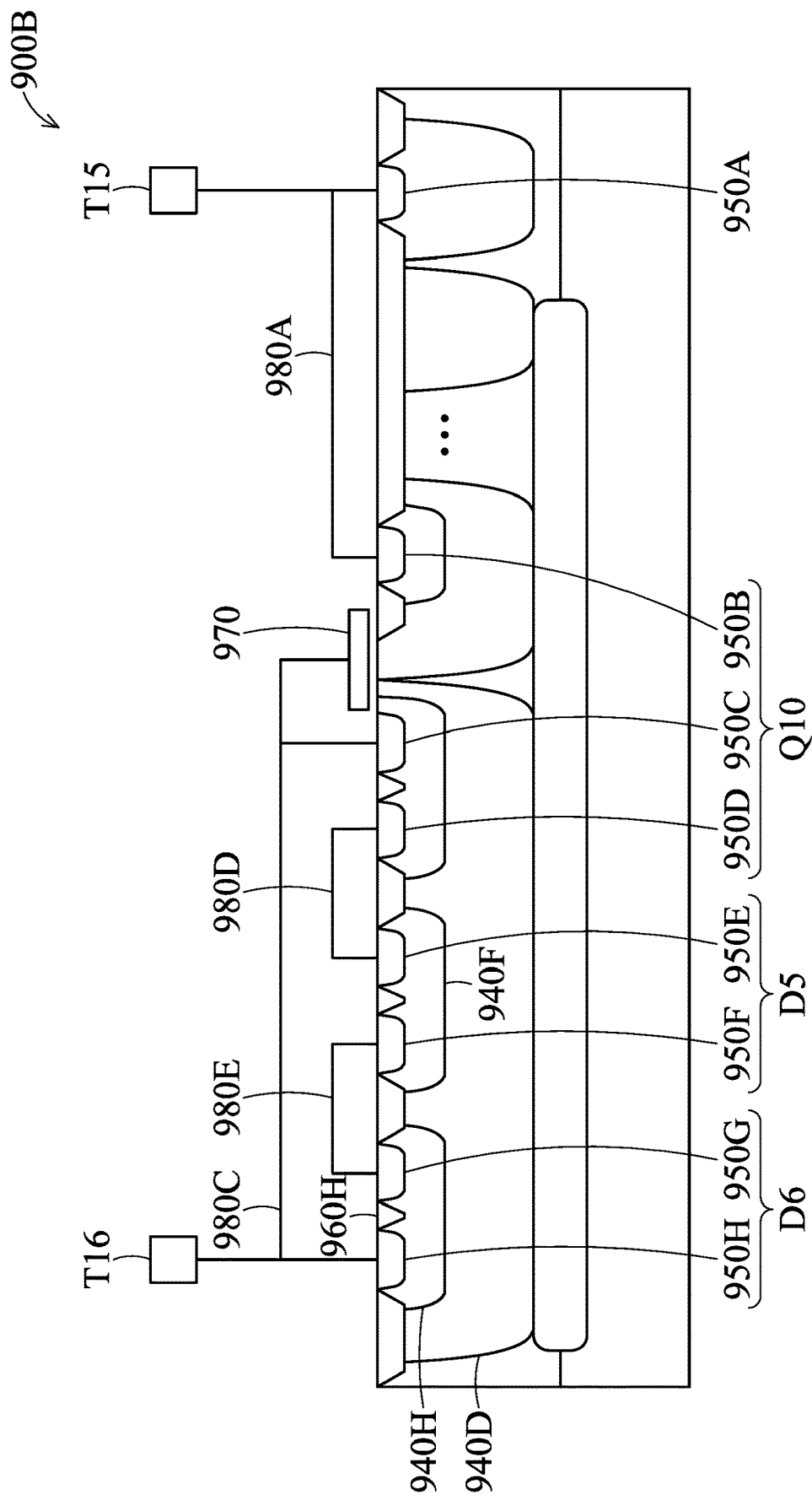

FIG. 9B is a schematic diagram of another exemplary embodiment of the semiconductor structure according to various aspects of the present disclosure. FIG. 9B is similar to FIG. 9A exception that the semiconductor structure 900B further comprises a well 940H, doped regions 950G and 950H. The well 940H is disposed in the well 940D and has the second conductivity type. In one embodiment, the doping concentration of the well 940H is similar to the doping concentration of the well 940F.

The doped regions 950G and 950H are disposed in the well 940H. The doped region 950G has the first conductivity type, and the doped region 950H has the second conductivity type. In this embodiment, each of the doped regions 950G and 950H is a heavily doped region. The doping concentration of the doped region 950G is similar to the doping concentration of the doped region 950E and higher than the doping concentration of the well 940H. The doping concentration of the doped region 950H is similar to the doping concentration of the doped region 950F. In this embodiment, the doped regions 950G and 950H constitute a diode D6. When the conductivity type of the doped region 950G is P-type and the conductivity type of the doped region 950H is N-type, the doped region 950G is served as the anode of the diode D6 and the doped region 950H is served as the cathode of the diode D6. In some embodiments, the semiconductor structure 900B further comprises an isolation structure 960H. The isolation structure 960H isolates the doped region 950G from the doped region 950H.

In this embodiment, the semiconductor structure 900B further comprises interconnect structures 980A and 980C~980E. The interconnect structure 980A is electrically connected to the input output terminal T15, the doped region 950A, and the doped region 950B. The interconnect structure 980D is electrically connected to the doped regions 950D and 950E. The interconnect structure 980E is electrically connected to the doped regions 950F and 950G. The interconnect structure 980C is electrically connected to the gate structure 970, the doped regions 950C and 950H, and the input output terminal T16. In this embodiment, the diode D5 is connected in series to the diode D6 between the emitter and the base of the high-voltage BJT Q10.

In other embodiments, the equivalent circuit of the semiconductor structure 900B of FIG. 9B is similar to the equivalent circuit shown in FIG. 5B. In this case, the diode D5 of FIG. 9B is served as the diode D1 of FIG. 5B, and the diode D6 of FIG. 9B is served as the diode D2 of FIG. 5B.

It should be understood that when an element or layer is referred to as being "on", "connected to" or "coupled to" another element or layer, it can be directly on, connected or coupled to the other element or layer or intervening elements or layers may be present. In contrast, when an element or layer is referred to as be "directly on", "directly connected to" or "directly coupled to" another element or layer, there are no intervening elements or layers present.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and should not be interpreted in an idealized or overly formal sense unless expressly so defined herein. It should be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure comprising
a substrate having a first conductivity type;
a first well disposed in the substrate and having a second conductivity type;
a first doped region disposed in the first well and having the second conductivity type;
a second doped region disposed in the first well and having the first conductivity type;
a third doped region disposed in the first well and having the first conductivity type;
a second well disposed in the first well;
a fourth doped region disposed in the second well and having the first conductivity type;
a fifth doped region disposed in the second well and having the second conductivity type,
a first interconnect structure electrically connecting the second doped region to the fifth doped region;
a second interconnect structure electrically connecting the first doped region to the fourth doped region;
a third well disposed in the substrate and having the first conductivity type;
a sixth doped region disposed in the third well and having the first conductivity type; and
a third interconnect structure electrically connecting the third doped region to the sixth doped region,
wherein the second well has the first conductivity type, and a doping concentration of the second well is higher than a doping concentration of the third well.

2. The semiconductor structure as claimed in claim 1, further comprising:
a fourth well disposed in the first well and having the second conductivity type,
wherein the second doped region is disposed in the fourth well, and a doping concentration of the fourth well is higher than a doping concentration of the first well.

3. The semiconductor structure as claimed in claim 1, further comprising:
a fifth well disposed in the first well and having the first conductivity type;
a seventh doped region disposed in the fifth well and having the first conductivity type;
an eighth doped region disposed in the fifth well and having the second conductivity type;
a second interconnect structure electrically connecting the first doped region to the fourth doped region;
a fourth interconnect structure electrically connecting the fifth doped region to the seventh doped region; and
a fifth interconnect structure electrically connecting the second doped region to the eighth doped region,
wherein the second well has the first conductivity type.

4. The semiconductor structure as claimed in claim 1, further comprising:
a third well disposed in the substrate and having the first conductivity type;
a sixth doped region disposed in the third well and having the first conductivity type;
a ninth doped region disposed in the second well and having the second conductivity type;
a third interconnect structure electrically connecting the third doped region to the sixth doped region;
a sixth interconnect structure electrically connecting the first doped region to the ninth doped region; and
a seventh interconnect structure electrically connected to the second doped region, the fourth doped region, and the fifth doped region,
wherein the second well has the first conductivity type and a doping concentration of the second well is higher than a doping concentration of the third well.

5. The semiconductor structure as claimed in claim 4, further comprising:
a first gate structure disposed on the second well and disposed between the fifth doped region and the ninth doped region,
wherein the first gate structure is electrically connected to the second doped region.

6. The semiconductor structure as claimed in claim 5, further comprising:
a first resistor coupled between the first gate structure and the fifth doped region.

7. The semiconductor structure as claimed in claim 1, further comprising:
a third well disposed in the substrate and having the first conductivity type;
a sixth doped region disposed in the third well and having the first conductivity type;
a tenth doped region disposed in the second well and having the first conductivity type;
a third interconnect structure electrically connecting the third doped region to the sixth doped region;
an eighth interconnect structure electrically connected to the first doped region, the fourth doped region, and the fifth doped region; and
a ninth interconnect structure electrically connecting the second doped region to the tenth doped region,
wherein the second well has the second conductivity type, and a doping concentration of the second well is higher than a doping concentration of the first well.

8. The semiconductor structure as claimed in claim 7, further comprising:
a second gate structure disposed on the second well and between the fourth doped region and the tenth doped region,
wherein the second gate structure is electrically connected to the eighth interconnect structure.

9. The semiconductor structure as claimed in claim 7, further comprising:
a second gate structure disposed on the second well and between the fourth doped region and the tenth doped region; and
a second resistor coupled to the second gate structure and the fourth doped region.

10. The semiconductor structure as claimed in claim 1, further comprising:
a sixth well disposed in the first well and having the second conductivity type;
an eleventh doped region disposed in the sixth well and having the first conductivity type;
a twelfth doped region disposed in the first well and having the first conductivity type; and a thirteenth doped region disposed in the first well and having the second conductivity type, wherein the second well has the first conductivity type, and a doping concentration of the sixth well is higher than a doping concentration of the first well.

11. The semiconductor structure as claimed in claim 10, wherein the first doped region and the thirteenth doped region form a ring-shape structure.

12. The semiconductor structure as claimed in claim 11, wherein the ring-shape structure surrounds the first doped region, the second doped region, the eleventh doped region, and the twelfth doped region.

13. An electrostatic discharge (ESD) protection device comprising:

a first high-voltage bipolar junction transistor (BJT) formed in a high-voltage well; and a first low-voltage element formed in a well disposed in the high-voltage well, wherein the first low-voltage element is coupled between a base and an emitter of the first high-voltage BJT, and wherein the first low-voltage element is a diode, an anode of the diode is coupled to the base of the first high-voltage BJT, and a cathode of the diode is coupled to the emitter of the first high-voltage BJT.

14. The ESD protection device as claimed in claim 13, further comprising:

a second high-voltage BJT formed in the high-voltage well and connected in parallel to the first high-voltage BJT.

15. The ESD protection device as claimed in claim 13, further comprising:

a second low-voltage element connected in series to the first low-voltage element between the base and the emitter of the first high-voltage BJT.

16. An electrostatic discharge (ESD) protection device comprising:

a first high-voltage bipolar junction transistor (BJT) formed in a high-voltage well; and a first low-voltage element formed in a well disposed in the high-voltage well, wherein the first low-voltage element is coupled between a base and an emitter of the first high-voltage BJT, and wherein the first low-voltage element is a metal oxide semiconductor (MOS) transistor comprising a gate and a source, and the source and the gate of the MOS transistor are connected to each other.

17. The ESD protection device as claimed in claim 16, further comprising:

a resistor coupled between the gate and the source.

* * * * *